United States Patent
Nygaard et al.

(10) Patent No.: US 9,466,719 B2
(45) Date of Patent: Oct. 11, 2016

(54) SEMICONDUCTOR-ON-INSULATOR WITH BACK SIDE STRAIN TOPOLOGY

(71) Applicant: QUALCOMM SWITCH CORP., San Diego, CA (US)

(72) Inventors: Paul A. Nygaard, Carlsbad, CA (US); Stuart B. Molin, San Diego, CA (US); Michael A. Stuber, Rancho Santa Fe, CA (US); Max Aubain, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/540,268

(22) Filed: Nov. 13, 2014

(65) Prior Publication Data

US 2015/0069511 A1    Mar. 12, 2015

Related U.S. Application Data

(63) Continuation-in-part of application No. 12/836,559, filed on Jul. 14, 2010, now Pat. No. 9,029,201.

(60) Provisional application No. 61/225,914, filed on Jul. 15, 2009.

(51) Int. Cl.
*H01L 21/78* (2006.01)
*H01L 29/78* (2006.01)
(Continued)

(52) U.S. Cl.
CPC .......... *H01L 29/7849* (2013.01); *H01L 21/78* (2013.01); *H01L 21/84* (2013.01);
(Continued)

(58) Field of Classification Search
CPC ....... H01L 21/78; H01L 21/84; H01L 23/36; H01L 23/3677; H01L 27/1203; H01L 29/0649; H01L 29/1033; H01L 29/7843; H01L 29/7849; H01L 29/78603; H01L 29/78606; H01L 29/78654
See application file for complete search history.

(56) References Cited

U.S. PATENT DOCUMENTS

| 4,053,916 A | 10/1977 | Cricchi et al. |
| 4,939,568 A | 7/1990 | Kato et al. |

(Continued)

FOREIGN PATENT DOCUMENTS

| CN | 1784785 A | 6/2006 |
| CN | 101140915 A | 3/2008 |

(Continued)

OTHER PUBLICATIONS

Notice of Allowance and Fees dated Feb. 11, 2015 for U.S. Appl. No. 12/836,559.
(Continued)

*Primary Examiner* — Whitney T Moore
*Assistant Examiner* — Joseph Galvin, III
(74) *Attorney, Agent, or Firm* — Haynes and Boone, LLC

(57) ABSTRACT

Embodiments of the present invention provide for the enhancement of transistors in a semiconductor structure using a strain layer. The structure comprises a patterned layer consisting of an excavated region and a pattern region, a strain layer located in the excavated region and on the pattern region, an active layer located above the strain layer, a field effect transistor formed in the active layer, and a handle layer located above the active layer. The field effect transistor comprises a source, a drain, and a channel. The channel lies completely within a lateral extent of the pattern region. The source and the drain each lie only partially within the lateral extent of the pattern region. The strain layer alters a carrier mobility of the channel. In some embodiments, the strain layer is introduced to the back side of a semiconductor-on-insulator structure.

20 Claims, 15 Drawing Sheets

(51) Int. Cl.

| | | |
|---|---|---|
| *H01L 29/06* | (2006.01) | |
| *H01L 29/10* | (2006.01) | |
| *H01L 21/84* | (2006.01) | |
| *H01L 23/36* | (2006.01) | |
| *H01L 23/367* | (2006.01) | |
| *H01L 29/786* | (2006.01) | |
| *H01L 27/12* | (2006.01) | |
| *H01L 23/00* | (2006.01) | |
| *H01L 21/762* | (2006.01) | |

(52) U.S. Cl.
CPC .......... *H01L 23/36* (2013.01); *H01L 23/3677* (2013.01); *H01L 27/1203* (2013.01); *H01L 29/0649* (2013.01); *H01L 29/1033* (2013.01); *H01L 29/7843* (2013.01); *H01L 29/78603* (2013.01); *H01L 29/78606* (2013.01); *H01L 29/78654* (2013.01); *H01L 21/76256* (2013.01); *H01L 24/03* (2013.01); *H01L 24/08* (2013.01); *H01L 24/11* (2013.01); *H01L 24/13* (2013.01); *H01L 24/29* (2013.01); *H01L 24/32* (2013.01); *H01L 24/48* (2013.01); *H01L 24/80* (2013.01); *H01L 24/83* (2013.01); *H01L 24/94* (2013.01); *H01L 2221/6834* (2013.01); *H01L 2221/6835* (2013.01); *H01L 2221/68377* (2013.01); *H01L 2224/03845* (2013.01); *H01L 2224/05572* (2013.01); *H01L 2224/08225* (2013.01); *H01L 2224/131* (2013.01); *H01L 2224/13022* (2013.01); *H01L 2224/13144* (2013.01); *H01L 2224/13147* (2013.01); *H01L 2224/16227* (2013.01); *H01L 2224/2919* (2013.01); *H01L 2224/29186* (2013.01); *H01L 2224/29188* (2013.01); *H01L 2224/32225* (2013.01); *H01L 2224/48* (2013.01); *H01L 2224/80006* (2013.01); *H01L 2224/8022* (2013.01); *H01L 2224/80801* (2013.01); *H01L 2224/80894* (2013.01); *H01L 2224/83005* (2013.01); *H01L 2224/8322* (2013.01); *H01L 2224/8385* (2013.01); *H01L 2224/83801* (2013.01); *H01L 2224/9202* (2013.01); *H01L 2224/9212* (2013.01); *H01L 2224/92142* (2013.01); *H01L 2224/94* (2013.01); *H01L 2924/00014* (2013.01); *H01L 2924/1305* (2013.01); *H01L 2924/3011* (2013.01)

(56) References Cited

U.S. PATENT DOCUMENTS

| | | | |
|---|---|---|---|
| 5,229,647 | A | 7/1993 | Gnadinger |
| 5,376,579 | A | 12/1994 | Annamalai |
| 5,434,750 | A | 7/1995 | Rostoker et al. |
| 5,489,792 | A | 2/1996 | Hu et al. |
| 5,580,802 | A | 12/1996 | Mayer et al. |
| 5,777,365 | A | 7/1998 | Yamaguchi et al. |
| 5,793,107 | A | 8/1998 | Nowak |
| 5,880,010 | A | 3/1999 | Davidson |
| 5,955,781 | A | 9/1999 | Joshi et al. |
| 5,999,414 | A | 12/1999 | Baker et al. |
| 6,027,958 | A | 2/2000 | Vu et al. |
| 6,080,608 | A | 6/2000 | Nowak |
| 6,110,769 | A | 8/2000 | Son |
| 6,121,659 | A | 9/2000 | Christensen et al. |
| 6,153,912 | A | 11/2000 | Holst |
| 6,180,487 | B1 | 1/2001 | Lin |
| 6,180,985 | B1 | 1/2001 | Yeo |
| 6,190,985 | B1 | 2/2001 | Buynoski |
| 6,191,476 | B1 | 2/2001 | Takahashi et al. |
| 6,229,187 | B1 | 5/2001 | Ju |
| 6,320,228 | B1 | 11/2001 | Yu |
| 6,352,882 | B1 | 3/2002 | Assaderaghi et al. |
| 6,437,405 | B2 | 8/2002 | Kim |
| 6,483,147 | B1 | 11/2002 | Lin |
| 6,498,370 | B1 | 12/2002 | Kim et al. |
| 6,531,753 | B1 | 3/2003 | Lin |
| 6,566,240 | B2 | 5/2003 | Udrea et al. |
| 6,573,565 | B2 | 6/2003 | Clevenger et al. |
| 6,740,548 | B2 | 5/2004 | Darmawan |
| 6,759,714 | B2 | 7/2004 | Kim et al. |
| 6,833,587 | B1 | 12/2004 | Lin |
| 6,847,098 | B1 | 1/2005 | Tseng et al. |
| 6,889,429 | B2 | 5/2005 | Celaya et al. |
| 6,900,501 | B2 | 5/2005 | Darmawan |
| 7,052,937 | B2 | 5/2006 | Clevenger et al. |
| 7,109,532 | B1 | 9/2006 | Lee et al. |
| 7,135,766 | B1 | 11/2006 | Costa et al. |
| 7,211,458 | B2 | 5/2007 | Ozturk et al. |
| 7,227,205 | B2 | 6/2007 | Bryant et al. |
| 7,238,591 | B1 | 7/2007 | Lin |
| 7,244,663 | B2 | 7/2007 | Kirby |
| 7,402,897 | B2 | 7/2008 | Leedy |
| 7,485,571 | B2 | 2/2009 | Leedy |
| 7,541,644 | B2 | 6/2009 | Hirano et al. |
| 7,713,842 | B2 | 5/2010 | Nishihata et al. |
| 7,759,220 | B2 | 7/2010 | Henley |
| 7,782,629 | B2 | 8/2010 | Graydon et al. |
| 7,888,606 | B2 | 2/2011 | Sakamoto et al. |
| 7,906,817 | B1 | 3/2011 | Wu et al. |
| 8,013,342 | B2 | 9/2011 | Bernstein et al. |
| 8,232,597 | B2 | 7/2012 | Stuber et al. |
| 8,357,975 | B2 | 1/2013 | Stuber et al. |
| 8,859,347 | B2 | 10/2014 | Stuber et al. |
| 8,912,646 | B2 | 12/2014 | Stuber et al. |
| 8,921,168 | B2 | 12/2014 | Stuber et al. |
| 9,029,201 | B2 | 5/2015 | Nygaard et al. |
| 9,034,732 | B2 | 5/2015 | Molin et al. |
| 2002/0027271 | A1 | 3/2002 | Vaiyapuri |
| 2002/0041003 | A1* | 4/2002 | Udrea ............ H01L 21/764 257/502 |
| 2002/0079507 | A1 | 6/2002 | Shim et al. |
| 2002/0086465 | A1 | 7/2002 | Houston |
| 2002/0089016 | A1 | 7/2002 | Joly et al. |
| 2002/0163041 | A1 | 11/2002 | Kim |
| 2002/0175406 | A1 | 11/2002 | Callahan |
| 2003/0085425 | A1 | 5/2003 | Darmawan |
| 2003/0107084 | A1* | 6/2003 | Darmawan ......... H01L 23/3677 257/347 |
| 2004/0051120 | A1 | 3/2004 | Kato |
| 2004/0150013 | A1 | 8/2004 | Ipposhi |
| 2004/0232554 | A1 | 11/2004 | Hirano et al. |
| 2004/0245627 | A1 | 12/2004 | Akram |
| 2004/0251557 | A1 | 12/2004 | Kee |
| 2005/0124170 | A1 | 6/2005 | Pelella et al. |
| 2005/0230682 | A1 | 10/2005 | Hara |
| 2005/0236670 | A1 | 10/2005 | Chien et al. |
| 2006/0065935 | A1 | 3/2006 | Vandentop et al. |
| 2006/0183339 | A1 | 8/2006 | Ravi et al. |
| 2006/0189053 | A1 | 8/2006 | Wang et al. |
| 2006/0243655 | A1 | 11/2006 | Striemer et al. |
| 2007/0018247 | A1 | 1/2007 | Brindle et al. |
| 2007/0085131 | A1 | 4/2007 | Matsuo et al. |
| 2007/0181992 | A1 | 8/2007 | Lake |
| 2007/0254457 | A1 | 11/2007 | Wilson et al. |
| 2007/0262428 | A1 | 11/2007 | Summers |
| 2008/0013013 | A1 | 1/2008 | Kim et al. |
| 2008/0050863 | A1 | 2/2008 | Henson et al. |
| 2008/0081481 | A1 | 4/2008 | Frohberg et al. |
| 2008/0112101 | A1 | 5/2008 | McElwee et al. |
| 2008/0124889 | A1* | 5/2008 | Roggenbauer .......... H01L 21/84 438/404 |
| 2008/0128900 | A1 | 6/2008 | Leow et al. |
| 2008/0150100 | A1 | 6/2008 | Hung et al. |
| 2008/0165521 | A1 | 7/2008 | Bernstein et al. |
| 2008/0283995 | A1 | 11/2008 | Bucki et al. |
| 2008/0286918 | A1* | 11/2008 | Shaviv ............ H01L 21/823412 438/211 |
| 2008/0288720 | A1 | 11/2008 | Atwal et al. |
| 2008/0296708 | A1 | 12/2008 | Wodnicki et al. |
| 2008/0308946 | A1 | 12/2008 | Pratt et al. |
| 2009/0011541 | A1 | 1/2009 | Corisis et al. |

(56) References Cited

U.S. PATENT DOCUMENTS

| | | | |
|---|---|---|---|
| 2009/0026454 | A1 | 1/2009 | Kurokawa et al. |
| 2009/0026524 | A1 | 1/2009 | Kreupl et al. |
| 2009/0073661 | A1 | 3/2009 | Wolfe et al. |
| 2009/0160013 | A1 | 6/2009 | Abou-Khalil et al. |
| 2010/0140782 | A1 | 6/2010 | Kim et al. |
| 2010/0244934 | A1 | 9/2010 | Botula et al. |
| 2010/0314711 | A1 | 12/2010 | Farooq et al. |
| 2011/0140257 | A1 | 6/2011 | Sweeney et al. |
| 2011/0266659 | A1 | 11/2011 | Wilson et al. |
| 2012/0161310 | A1 | 6/2012 | Brindle et al. |
| 2012/0205725 | A1 | 8/2012 | Nygaard et al. |
| 2013/0043595 | A1 | 2/2013 | Williams |
| 2014/0175637 | A1 | 6/2014 | Stuber et al. |
| 2015/0108640 | A1 | 4/2015 | Stuber et al. |
| 2015/0140782 | A1 | 5/2015 | Stuber et al. |
| 2015/0249056 | A1 | 9/2015 | Molin et al. |

FOREIGN PATENT DOCUMENTS

| | | | |
|---|---|---|---|
| EP | 0707388 | A2 | 4/1996 |
| EP | 0986104 | A1 | 3/2000 |
| GB | 2309825 | A | 8/1997 |
| GB | 2418063 | A | 3/2006 |
| JP | 2110974 | | 4/1990 |
| JP | 03011666 | | 1/1991 |
| JP | 04356967 | | 12/1992 |
| JP | 07098460 | | 4/1995 |
| JP | 9283766 | | 10/1997 |
| JP | 2001230423 | A | 8/2001 |
| JP | 2005175306 | A | 6/2005 |
| JP | 2006186091 | | 7/2006 |
| JP | 2008004577 | A | 1/2008 |
| WO | 0225700 | A2 | 3/2002 |
| WO | 2008011210 | A1 | 1/2008 |
| WO | 2009045859 | A1 | 4/2009 |

OTHER PUBLICATIONS

Notice of Allowance and Fees dated Feb. 20, 2015 for U.S. Appl. No. 12/836,510.
Office action dated Feb. 4, 2015 for Chinese patent application No. 201080031818.X.
Office Action dated Jan. 20, 2015 for Japanese Patent Application No. 2012-520758.
Office Action dated Jan. 6, 2015 for Chinese patent application No. 201080031811.8.
Office Action dated Mar. 27, 2015 for U.S. Appl. No. 14/572,580.
Office Action dated Mar. 5, 2015 for U.S. Appl. No. 13/725,403.
Official Letter and Search Report dated Feb. 13, 2015 for Taiwanese patent application No. 99123128.
Official Letter and Search Report dated Mar. 6, 2015 for Taiwanese Patent Application No. 99123144.
Extended European Search Report dated Sep. 22, 2015 for European Patent Application No. 15171021.7.
Notice of Allowance and Fees dated Aug. 31, 2015 for U.S. Appl. No. 14/572,580.
Office Action dated Aug. 4, 2015 for U.S. Appl. No. 13/725,403.
Office Action dated Aug. 5, 2015 for Chinese Patent Application No. 201080031818.X.
Office Action dated Sep. 2, 2015 for U.S. Appl. No. 14/586,668.
Official letter and search report dated Sep. 9, 2015 for Taiwanese Patent Application No. 099123131.
Office Action dated Apr. 13, 2015 in U.S. Appl. No. 14/586,668.
European Examination Report dated Mar. 19, 2013 for European Application No. 10 734 619.9.
Examination report dated Nov. 29, 2013 for European Application No. 10734619.9.
International Search Report and Written Opinion dated Oct. 14, 2010 for PCT/US2010/042026.
International Search Report and Written Opinion dated Oct. 14, 2010 for PCT/US2010/042028.
International Search Report and Written Opinion dated Mar. 22, 2011 for International Application No. PCT/US2010/042027.
International Search Report and Written Opinion dated Mar. 31, 2014 for PCT Application No. PCT/US2013/073466.
Notice of Allowance and Fees dated Aug. 19, 2014 for U.S. Appl. No. 13/725,245.
Notice of Allowance and Fees dated Aug. 20, 2014 for U.S. Appl. No. 13/725,306.
Notice of Allowance and Fees dated Jun. 18, 2014 for U.S. Appl. No. 13/746,288.
Notice of Allowance and Fees dated Nov. 27, 2012 for U.S. Appl. No. 13/459,110.
Notice of Allowance dated Mar. 22, 2012 for U.S. Appl. No. 12/836,506.
Office Action dated Apr. 23, 2014 for Chinese Patent Application No. 201080031814.1.
Office action dated Apr. 3, 2014 for U.S. Appl. No. 13/746,288.
Office Action dated Apr. 8, 2014 for Japanese Patent Application No. 2012-520758.
Office Action dated Aug. 29, 2014 for U.S. Appl. No. 12/836,510.
Office Action Dated Dec. 12, 2012 for U.S. Appl. No. 13/452,836.
Office action dated Dec. 2, 2013 for Chinese Patent Application No. 201080031818.X.
Office Action Dated Feb. 10, 2014 for U.S. Appl. No. 13/725,403.
Office Action dated Jan. 27, 2012 for U.S. Appl. No. 12/836,506.
Office Action dated Jul. 10, 2014 from Chinese Patent Application No. 201080031811.8.
Office Action dated Jul. 13, 2012 for U.S. Appl. No. 12/836,510.
Office Action dated Jul. 17, 2014 for U.S. Appl. No. 13/725,403.
Office Action dated Jul. 28, 2014 for Chinese Patent Application No. 201080031818.X.
Office Action dated Mar. 20, 2014 for U.S. Appl. No. 13/725,245.
Office action dated Mar. 28, 2014 for U.S. Appl. No. 13/725,306.
Office Action dated Nov. 9, 2012 for U.S. Appl. No. 12/836,510.
Office Action dated Nov. 5, 2013 for Chinese Patent Application No. 201080031811.8.
Office Action dated Oct. 24, 2012 for U.S. Appl. No. 13/459,110.
Office action dated Oct. 30, 2014 for U.S. Appl. No. 13/725,403.
Office Action dated Oct. 4, 2013 for U.S. Appl. No. 13/746,288.
Sematech Manufacturing and Reliability Challenges for 3D ICs using TSVs, Sep. 25-26, 2008, San Diego, California "Thermal and Strees Analysis Modeling for 3D Memory over Processor Stacks", John McDonald, Rochester Polytechnic Institute.
Sleight, Jeffry W. et al., "DC and Transient Characterization of a Compact Schottky Body Contact Technology for SOI Transistors", IEEE Transactions on Electronic Devices, IEEE Service Center, Pisacataway, NJ, US, vol. 46, No. 7, Jul. 1, 1999.
Guarini K.W., et al., "Electrical integrity of state-of-the-art 0.13 μm SOI CMOS devices and circuits transferred for three-dimensional (3D) integrated circuit (IC) fabrication," in Electron Devices Meeting, 2002, Dec. 8-11, 2002, pp. 943-945.
Matloubian, M. "Smart Body Contact for SOI MOSFETs", SOS/SOI Technology Conference, Oct. 3-5, 1989.
Tan C.S., et al., "Wafer Level 3-D ICs Process Technology," Series on Integrated Circuits and Systems, 2008, Springer, chapters 4, 5, 6, 8, 9, 10, and 12 (entire).
International Search Report and Written Opinion—PCT/US2015/060463—ISA/EPO—Feb. 22, 2016.

* cited by examiner

SEMICONDUCTOR-ON-INSULATOR WITH BACK SIDE STRAIN TOPOLOGY

CROSS-REFERENCE TO RELATED APPLICATIONS

This patent application is a continuation-in-part of U.S. application Ser. No. 12/836,559, filed Jul. 14, 2010, which claims the benefit of U.S. Provisional Application No. 61/225,914, filed Jul. 15, 2009, the contents of which are incorporated herein by reference.

BACKGROUND OF THE INVENTION

Semiconductor-on-insulator (SOI) technology was first commercialized in the late 1990s. The defining characteristic of SOI technology is that the semiconductor region in which circuitry is formed is isolated from bulk substrate by an electrically insulating layer. This insulating layer is typically silicon-dioxide. The reason silicon-dioxide is chosen is that it can be formed on a wafer of silicon by oxidizing the wafer and is therefore amenable to efficient manufacturing. The advantageous aspects of SOI technology stem directly from the ability of the insulator layer to electronically isolate the active layer from bulk substrate. As used herein and in the appended claims, the region in which signal-processing circuitry is formed on an SOI structure is referred to as the active layer of the SOI structure.

SOI technology represents an improvement over traditional bulk substrate technology because the introduction of the insulating layer isolates the active devices in an SOI structure which improves their electrical characteristics. For example, the threshold voltage of a transistor is desirously uniform, and is set in large part by the characteristics of the semiconductor material underneath the transistor's gate. If this region of material is isolated, there is less of a chance that further processing will affect this region and alter the threshold voltage of the device. Additional electrical characteristic improvements stemming from the use of the SOI structure include fewer short channel effects, decreased capacitance for higher speed, and lower insertion loss if the device is acting as a switch. In addition, the insulating layer can act to reduce the effects on active devices from harmful radiation. This is particularly important for integrated circuits that are used in space given the prevalence of harmful ionizing radiation outside the earth's atmosphere.

SOI wafer 100 is shown in FIG. 1. The wafer includes substrate layer 101, insulator layer 102, and active layer 103. The substrate is typically a semiconductor material such as silicon. Insulator layer 102 is a dielectric which is often silicon-dioxide formed through the oxidation of substrate layer 101. Active layer 103 includes a combination of dopants, dielectrics, polysilicon, metal layers, passivation, and other layers that are present after circuitry 104 has been formed therein. Circuitry 104 may include metal wiring; passive devices such as resistors, capacitors, and inductors; and active devices such as transistors. As used herein and in the appended claims, the "top" of SOI wafer 100 references top surface 105 while the "bottom" of SOI wafer 100 references bottom surface 106. This orientation scheme persists regardless of the relative orientation of SOI wafer 100 to other frames of reference, and the removal of layers from, or the addition of layers to SOI wafer 100. Therefore, active layer 103 is always "above" insulator layer 102. In addition, a vector originating in the center of active layer 103 and extending towards bottom surface 106 will always point in the direction of the "back side" of the SOI structure regardless of the relative orientation of SOI wafer 100 to other frames of references, and the removal of layers from, or the addition of layers to SOI wafer 100.

SOI devices are imbued with the ability to enhance and preserve the electrical characteristics of their active devices as described above. However, the introduction of the insulator layer creates a significant problem in terms of the device's ability to dissipate heat. Due to the increasing miniaturization of the devices in integrated circuits, a greater number of heat generating devices must be pressed into a smaller and smaller area. In modern integrated circuits, the heat generation density of circuitry 104 can be extreme. The introduction of insulator layer 102 exacerbates this problem because the thermal conductivity of insulator layer 102 is generally much lower than that of a standard bulk substrate. As mentioned previously, silicon-dioxide is the ubiquitous insulator layer in modern SOI technology. At a temperature of 300 degrees Kelvin (K), silicon-dioxide has a thermal conductivity of roughly 1.4 Watts per meter per Kelvin (W/m*K). A bulk silicon substrate at the same temperature has a thermal conductivity of roughly 130 W/m*K. The nearly 100-fold reduction in heat dissipation performance exhibited by SOI technology is highly problematic. A high level of heat in an integrated circuit can shift the electrical characteristics of its devices outside an expected range causing critical design failures. Left unchecked, excess heat in a device can lead to permanent and critical failures in the form of warping or melting materials in the device's circuitry.

The problem of heat dissipation in SOI devices has been approached using variant solutions. One approach involves the deposition of heat channeling pillars from the insulator layer 102 up through active layer 103. In some cases, these heat channeling pillars are formed of metal since metal generally has a much higher thermal conductivity as compared to silicon-dioxide. In some approaches, these pillars are formed of polysilicon so that they do not interfere with the electrical performance of the circuit, while at the same time they provide a thermal path up and away from insulator layer 102. In other approaches, a hole is cut through insulator layer 102 and heat channeling pillars are deposited into the holes. The result of this configuration is to provide a thermal dissipation channel from active layer 103 through holes in insulator layer 102 down to substrate 101. This heat is then dissipated through substrate 101.

Another approach to the problem of heat dissipation in SOI devices involves operating on the wafer from the backside. FIG. 1B illustrates how SOI wafer 100 can be bonded to a handle wafer 107 comprised of handle substrate 108, and handle insulator layer 109. Although this is a common type of handle, insulator layer 109 does not have to be an insulator material as certain modern processes use handle wafers with semiconductor material, or conductive material in place of insulator layer 109. After bonding to the handle wafer, the resultant structure can then be flipped upside down to form the structure shown in FIG. 1B. Under this approach, substrate 101 and insulator layer 102 are then selectively removed from the back of SOI wafer 100. Following the removal of substrate 101, and the selective removal of insulator layer 102, a layer of metal 110 is deposited on the etched regions to allow for a greater degree of thermal conductivity through insulator layer 102. This metal is often used secondarily as a ground wire or informational signal wire for devices in active layer 103 when the integrated circuit is operational. Although the resultant structure exhibits thermal dissipation capabilities that are superior to those of an SOI structure without backside heat dissipation, the fact that the insulator layer is removed directly underneath the active substrate diminishes the advantages of the SOI structure in terms of its ability to preserve and enhance the electrical characteristics of active devices.

SUMMARY OF INVENTION

In one embodiment of the invention, a semiconductor structure is disclosed. The structure comprises a patterned layer consisting of an excavated region and a pattern region, a strain layer located in the excavated region and on the pattern region, an active layer located above the strain layer, a field effect transistor formed in the active layer, and a handle layer located above the active layer. The field effect transistor comprises a source, a drain, and a channel. The channel lies completely within a lateral extent of the pattern region. The source and the drain each lie only partially within the lateral extent of the pattern region. The strain layer alters a carrier mobility of the channel.

In another embodiment of the invention, another semiconductor structure is disclosed. The structure comprises an active layer bonded to a handle layer. The handle layer is on a first side of the active layer. The structure also comprises a patterned layer on a second side of the active layer. The pattern layer consists of an excavated region and a pattern region. The structure also comprises a strain layer located on the pattern region and in the excavated region. The strain layer exhibits a strain on a device in the active layer. The device is a field effect transistor having a source, a drain, and a channel, the channel being between the source and the drain. The pattern region fully encompasses the channel and only partially encompasses the source and the drain.

In another embodiment of the invention, another semiconductor structure is disclosed. The structure comprises an etched patterned layer formed on a back side of semiconductor structure, a strain layer formed on the etched patterned layer, a handle layer bonded to a front side of the semiconductor structure, an active layer located between the patterned layer and the handle layer, and a field effect transistor formed in the active layer. The field effect transistor comprises an active area. The field effect transistor comprises a channel. A portion of the etched patterned layer has a lateral extent beyond the channel. The field effect transistor has a lateral extent beyond the portion. The strain layer is in contact with the active area.

DETAILED DESCRIPTION OF THE PREFERRED EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers such modifications and variations as are within the scope of the appended claims and their equivalents.

Embodiments of the present invention provide for the production of SOI devices that have improved heat dissipation performance while preserving the beneficial electrical device characteristics that accompany SOI architectures. In addition, devices with the aforementioned benefits can be manufactured in accordance with the present invention with very little modification to manufacturing processes that are used most often in the semiconductor industry. This is a huge advantage given that compatibility with existing manufacturing processes avoids the need for the nearly insurmountable fixed production cost investments that can face novel semiconductor solutions. Embodiments of the invention achieve this result through the utilization of back side processing, the removal of portions of the SOI buried insulator layer, and the deposition of thermal dissipation layers in variant configurations on the back side of the SOI structure.

Figure 1A:
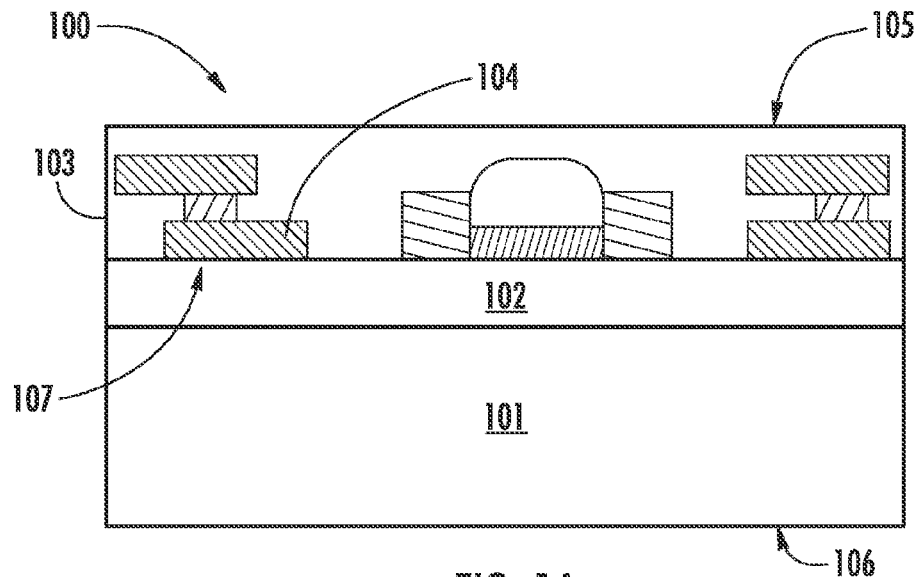
FIGS. 1A and 1B illustrate a block diagram of a process and apparatus for thermal dissipation in an SOI structure that are in accordance with the prior art.
Figure 1B:
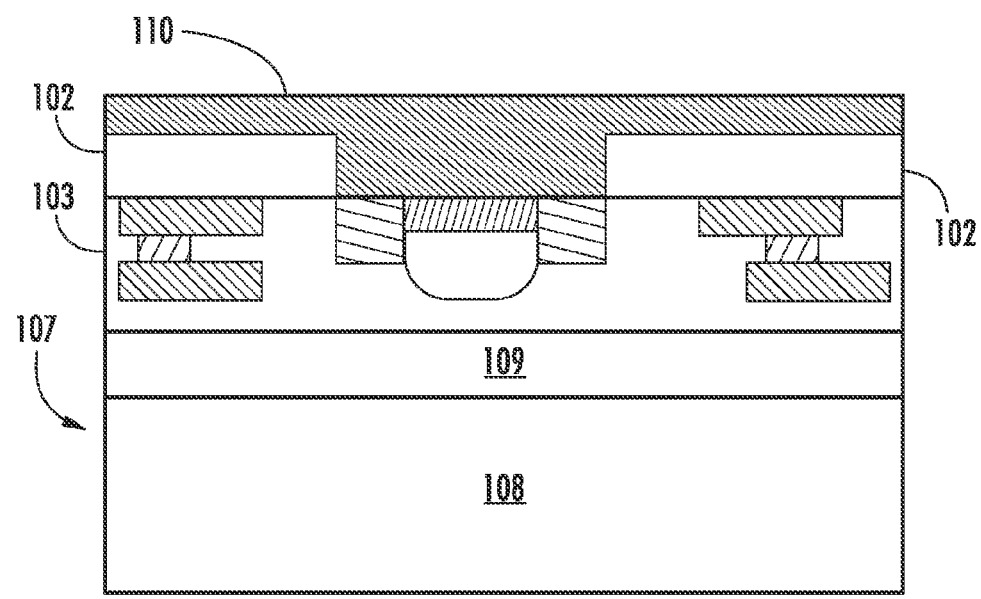
Figure 2:
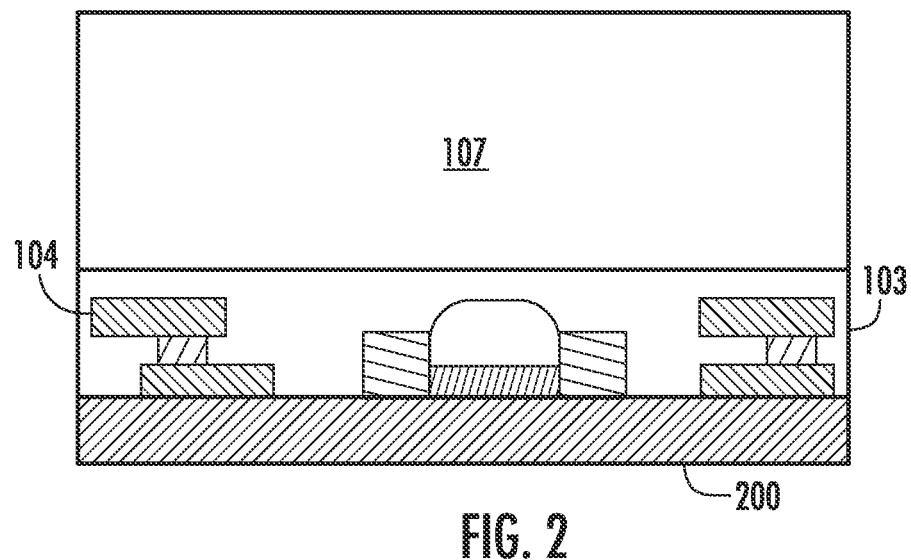
FIG. 2 illustrates a block diagram of an SOI structure with a thermal dissipation layer that is in accordance with the present invention.

An SOI structure that is in accordance with the present invention can be described with reference to FIG. 2. As shown in FIG. 2, active layer 103 is disposed on handle wafer 107. Notable, when the SOI structure is singulated, handle wafer 107 can be referred to as a handle layer because a portion of the handler wafer is singulated along with the device. In accordance with the convention described above, handle wafer 107 is above active layer 103. In addition, active layer 103 is above thermal dissipation layer 200. Thermal dissipation layer 200 is thermally conductive and electrically insulating. Materials that could be used to form thermal dissipation layer 200 include diamond, diamond-like carbon, silicon carbide, aluminum oxide, aluminum nitride, beryllium oxide, beryllium nitride, graphene, and certain carbon formations like carbon nanotubes.

Selecting a material for thermal dissipation layer 200 that is both electrically insulating and thermally conductive preserves the beneficial electrical characteristics provided by SOI technology while greatly diminishing the heat dissipation problems faced by traditional SOI devices using silicon-dioxide insulator layers. As an example, the thermal conductivity of pure synthetic diamond at 300 K is roughly 3,300 W/m*K and the thermal conductivity of beryllium oxide is 260 W/m*K. This is in comparison to the non-thermally conductive silicon-dioxide layer in a traditional SOI structure which—as mentioned previously—has a thermal conductivity of 1.4 W/m*K. As used herein and in the appended claims, a layer of material has high thermal conductivity if its thermal conductivity is greater than 50 W/m*K. Both diamond and beryllium-oxide provide a greater than 100-fold improvement in heat dissipation performance over the traditional SOI structure. In specific embodiments of the invention, insulator layer 102 is at least partially removed, and another very thin insulator layer is deposited before a layer of thermally conductive material is deposited to form thermally conductive layer 200. The extreme thinness of the insulating layer enhances the structure's ability to dissipate heat from active layer 103 to the thermally conductive material layer. For example, the deposited insulating layer can comprise a thin layer of the same material as the original insulator layer. The benefit of a thermally conductive and electrically nonconductive material is realized by the preservation of the electronic characteristics of active devices in active layer 103 without being limited by the poor heat dissipation characteristic of traditional SOI structures.

The structure displayed in FIG. 2 is produced using back side processing. Since the SOI structure is operated upon from the back side—in contrast to typical SOI processing methods—the material used for thermal dissipation layer 200 does not need to be selected for its ability to provide stability to active layer 103 or to act as a suitable substrate for the production of circuitry in active layer 103. This is because the original insulator layer—insulator layer 102—serves as the base layer while circuitry is produced, and handle wafer 107 provides support during back side processing. The removal of insulator layer 102 would usually be undesirable because insulator layer 102 and substrate 101 provide mechanical support to active layer 103. Further processing of active layer 103 without these layers in place would likely be disastrous for circuitry 104. However, the addition of handle wafer 107 at this stage allows for additional processing of the integrated circuit. Methods used for this backside processing are described in more detail below.

Another advantageous aspect of back side processing is that it allows for the addition of thermal dissipation layer 200 at a later stage of semiconductor processing, which in turn allows for the use of materials for thermal dissipation layer 200 that could not otherwise be applied. In contrast to traditional approaches, back side processing allows for the addition of thermal dissipation layer 200 after semiconductor processing of active layer 103 is complete. Certain phases of the semiconductor production process require temperatures in excess of 1000° C. Certain materials cannot withstand these temperatures and are therefore generally considered to be inadequate for usage as a thermal spreading layer located in place of thermal dissipation layer 200. However, the use of back side processing allows for the usage of more fragile materials for thermal dissipation layer 200.

Figure 3:
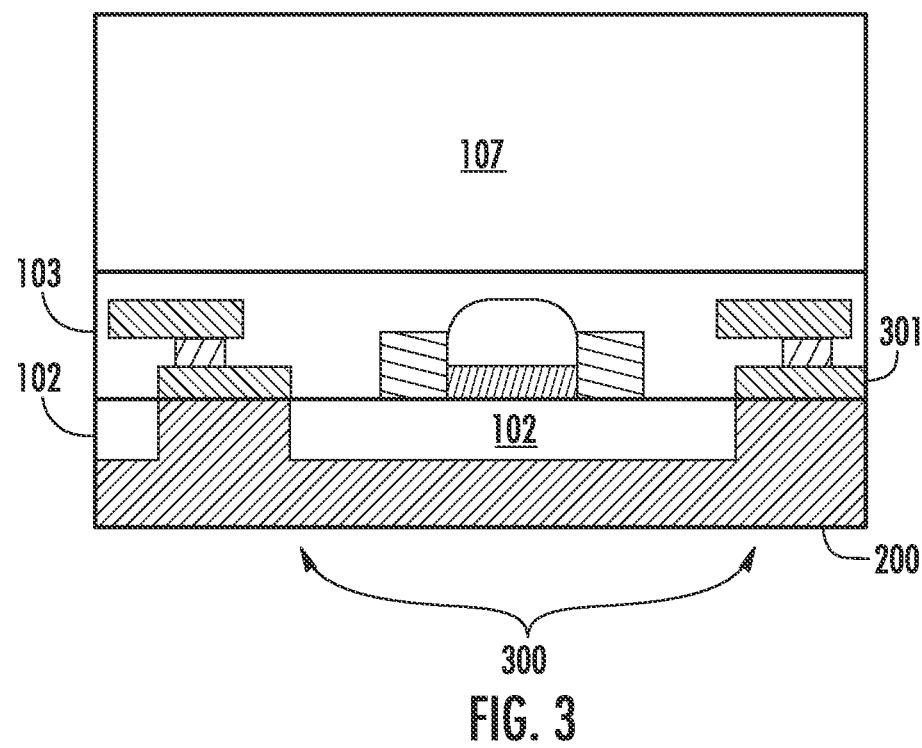
FIG. 3 illustrates a block diagram of an SOI structure having a thermal dissipation layer and a patterned insulator layer that is in accordance with the present invention.

An integrated circuit that is in accordance with the present invention can be described with reference to FIG. 3. In FIG. 3, active layer 103 is disposed on insulator layer 102 as is common in SOI devices. However, insulator layer 102 has been excavated in certain portions to form a pattern defined by excavated insulator region 300. The excavated insulator region does not have to be contiguous, but rather insulator layer 102 can be patterned in various ways to expose different portions of active layer 103. In FIG. 3, thermal dissipation layer 200 has been applied to the entire back surface of the integrated circuit, including in excavated insulator region 300. In specific embodiments of the invention, thermal dissipation layer 200 is disposed only in the excavated insulator region 300. In specific embodiments of the invention, thermal dissipation layer 200 is patterned and is only disposed in a portion of excavated insulator region 300. In FIG. 3, excavated insulator region 300 is illustrated by the complete removal of all insulator material in the excavated region. However, in specific embodiments of the invention, excavated insulator region 300 may consist of a residual thin insulation layer. The initial thickness of the insulator layer typically ranges from 100 nanometers (nm) to 1000 nm. The thin insulation layer can range from 5 nm to 100 nm. However, any degree of thinning would result in a thin insulator layer. A mono-layer—on the order of 1 nm—of residual insulator material would suffice though this could be difficult to achieve using traditional methods. Any degree of thinning would constitute an improvement over the initial structure in terms of thermal dissipation capabilities. The structure shown in FIG. 3 may retain the benefits of enhanced electrical characteristics provided by isolating devices in active layer 103 while at the same time providing for enhanced thermal dissipation as heat can flow laterally through active layer 103 and then dissipate out through thermal dissipation layer 200 where the insulator has been thinned or removed.

The benefits and drawbacks of the removal of insulator layer 102 may be balanced by the formation of specific patterns for excavated insulator region 300. For example, excavated insulator region 300 may be made coextensive with a lowest layer of metal wiring in active layer 103. As shown in FIG. 3, excavated insulator region 300 is laterally coextensive with lowest metal layer 301. In specific embodiments of the invention, excavated insulator region 300 exposes specific portions of lowest metal layer 301. In specific embodiments of the invention, excavated insulator region 300 exposes all of lowest metal layer 301. In specific embodiments of the present invention, lowest metal layer 301 is the lowest layer of wiring for the circuitry formed in active layer 103. This configuration is highly advantageous from a balancing perspective in that metal wires will not generally suffer from altered electrical characteristics if they are not placed on an insulator. In addition, metal is highly thermally conductive, and metal wiring usually links to active devices making these metal lines highly efficient channels for thermal dissipation. Although a vast majority of the heat generated in active layer 103 is generated by active devices, heat will dissipate from these active devices to the metal lines and then out through the back of the SOI structure through thermal dissipation layer 200. This approach is generally superior to routing heat up and out of the top of an SOI structure through metal lines because modern circuitry has a large number of metal layers making the back side route a more direct exit channel.

Figure 4:
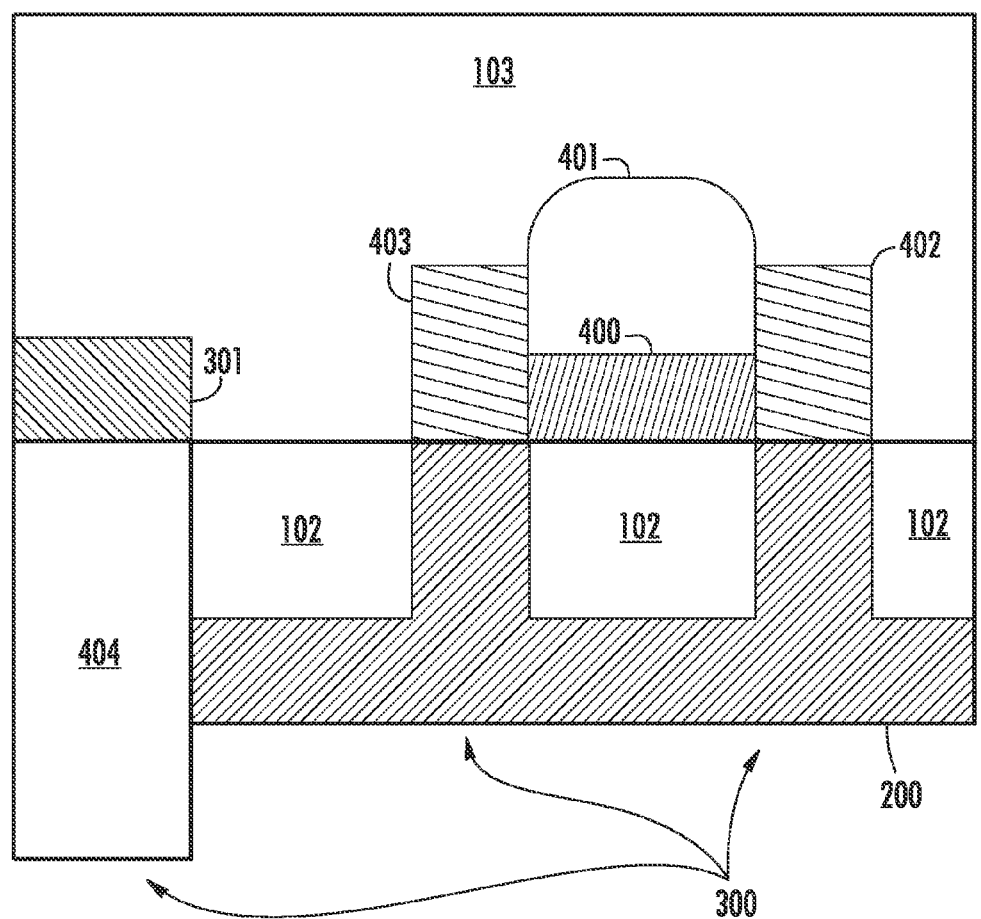
FIG. 4 illustrates a block diagram of an SOI structure having a thermal dissipation layer, patterned insulator layer, and a back side metal contact.

Another semiconductor-on-insulator structure that is in accordance with the present invention can be described with reference to FIG. 4. The integrated circuit shown in FIG. 4 can be used to describe an additional set of patterns for excavated insulator region 300 that provide advantageous heat dissipation capabilities to an SOI structure. In FIG. 4, a channel region 400 of a transistor with transistor gate 401 is within the lateral scope of insulator layer 102. However, excavated insulator region 300 exposes transistor drain 402 and transistor source 403 as excavated insulator region 300 is laterally coextensive with transistor drain 402 and transistor source 403. Thermal dissipation layer 200 is disposed in the portions of excavated insulator region 300 that expose transistor drain 402 and transistor source 403. Metal contact 404 is disposed in another portion of excavated insulator region 300. In specific embodiments of the invention, metal contact 404 is not electrically active but is instead present to provide a heat dissipation path. In specific embodiments of the present invention, metal contact 404 can serve as an electrical contact for circuitry in active layer 103. For example, metal contact 404 could be a signal wire for carrying an informational signal out of the circuitry in active layer 103 for use by another system. In another example, metal contact 404 could be a ground or power line for circuitry in active layer 103. In specific embodiments of the invention, bump metal processing deposits bump metal contacts on the SOI structure displayed in FIG. 4 such that metal contact 404 is a bump metal connector for the SOI structure. In the embodiments described above where metal contact 404 is not electrically active, metal contact 404 does not have to be metal and instead can be any material with good thermal conductivity. In specific embodiments of the invention, these metal contacts are metal pillar contacts. The metal pillar contacts can be comprised of gold or copper. These materials would perform advantageously as compared to solder bumps because they are much better heat conductors as compared to solder. In specific embodiments of the invention, metal contact 404 allows for attachment to a circuit board. In specific embodiments of the invention, the metal contacts can allow for attachment to a low temperature co-fired ceramic substrate, a module board, an integrated circuit, bump metal, gold bump metal, copper pillars, gold pillars, and any metal connection.

In specific embodiments of the present invention, excavated insulator region 300 will be laterally coextensive with portions of the active devices in active layer 103. As shown in FIG. 4, these embodiments could include exposure of transistor drain 402, and transistor source 403, while keeping transistor channel 400 covered by insulator layer 102. Such embodiments would exhibit the advantageous aspect of having isolated channel regions while allowing a highly proximate thermal dissipation channel. Since channel 400 remains covered by insulator layer 102, the electrical characteristics of the transistor will be preserved. The transistors will exhibit less leakage current and substrate capacitance as well as a more controlled threshold voltage. Also, since the source and drain of a transistor are directly adjacent to the transistor channel, there is a very direct channel to thermal dissipation layer 200. In other specific embodiments of the invention, excavated insulator region 300 only exposes a subset of the active devices in an SOI structure. In other specific embodiments of the invention, excavated insulator region 300 will expose other subsets of regions of an individual active device in an SOI structure.

In specific embodiments of the present invention, metal contact 404 is disposed in a first portion of excavated insulator region 300. Additionally, thermal dissipation layer 200 is disposed in a second portion of said excavated insulator region 300, and is also disposed on a side of metal contact 404. Such a configuration can be seen in FIG. 4. Heat will be able to dissipate directly from active layer 103 through metal contact 404. In addition, heat will be able to flow laterally through thermal dissipation layer 200 and then out through metal contact 404. Although FIG. 4 displays this embodiment in combination with an embodiment wherein excavated oxide region 300 is patterned to correspond with regions of active layer 103, these embodiments can function independently.

Any of the embodiments discussed above in regards to the use of excavated insulator region 300 to pattern the alignment of thermal dissipation layer 200 with portions of active layer 103 may be used independently or in combination. In addition, the pattern removal of insulator material to form excavated insulator region 300 can be combined with the patterned deposition of thermal dissipation layer 200. For example, thermal dissipation layer 200 could be disposed on the entire back side of the SOI structure, could only be disposed in excavated insulator region 300, or could be disposed in a portion of excavated insulator region 300. Methods of patterning thermal dissipation layer 200 are discussed below.

Embodiments of the invention where either the excavated insulator region 300 or additionally the thermal dissipation layer 200 are patterned exhibit advantageous characteristics. Although thermal dissipation layer 200 is electrically insulating there are certain advantages that accrue from leaving the original insulator material behind in certain regions. For example, it is possible for thermal dissipation layer 200 to comprise a material that is less electrically insulating than the original oxide. The material could be selected to minimize cost and maximize thermal conductivity in sacrifice of its electrically insulating capacity. In portions of active layer 103 where electrical conductivity was important, the original insulator could be left and excavated insulator region 300 could be located elsewhere. In this way, patterning allows for another degree of freedom in selecting an optimal material for thermal dissipation layer 200.

Patterning excavated insulator region 300 provides another benefit in that in can limit the creation of interface states in active layer 103. Even if thermal dissipation layer 200 is a good electrical insulator, the original insulator will generally be in better physical contact with active layer 103 because removal of the original insulator causes the creation of dangling bonds that will not be reconnected when thermal dissipation layer 200 is applied. This will result in the creation of interface states that can cause problems for circuitry in active layer 103. Patterning excavated insulator region 300 can advantageously limit the creation of these interface states in key areas of active layer 103 by allowing the original insulator to remain in contact with these key areas.

Figure 5:
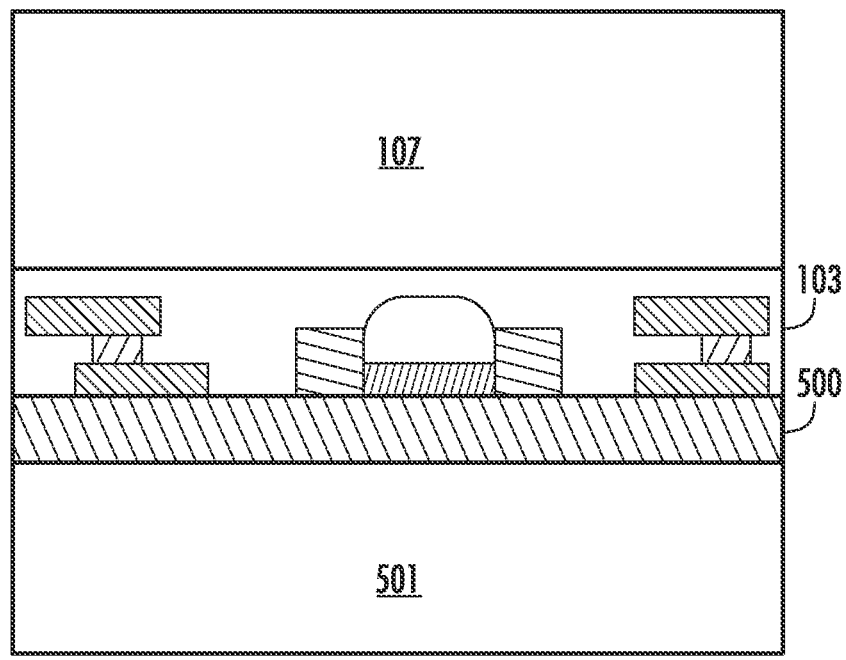
FIG. 5 illustrates a block diagram of an SOI structure having an attached back side thermal dissipation handle wafer that is in accordance with the present invention.

Another SOI structure that is in accordance with the present invention can be described with reference to FIG. 5. According to the convention discussed previously, FIG. 5 illustrates active layer 103 below handle wafer 107. As described in reference to other embodiments of the invention, insulator layer 102 and substrate 101 have been removed from the bottom of active layer 103 through back side processing. In specific embodiments of the invention, handle wafer 107 is bonded to active layer 103 through a temporary bond. This means that the bond can be easily undone during later stages of semiconductor processing. In specific embodiments of the invention, a permanent second handle wafer—illustrated as permanent handle thermal dissipation layer 500 and permanent handle substrate layer 501—are bound directly to active layer 103 during backside processing. In specific embodiments of the invention, permanent handle substrate layer 501 consists of the same material as permanent handle thermal dissipation layer 500. This structure can allow for a level of thermal dissipation capability commensurate with that of previously mentioned embodiments, but will also advantageously allow for top side bonding to circuitry in active layer 103 using conventional techniques. Since handle wafer 107 is bound through a temporary bond, it can be removed after the support it provided during back side processing is no longer needed. Thereafter, active layer 103 will have its top side exposed to allow for top side bonding and various other applications.

Figure 6:
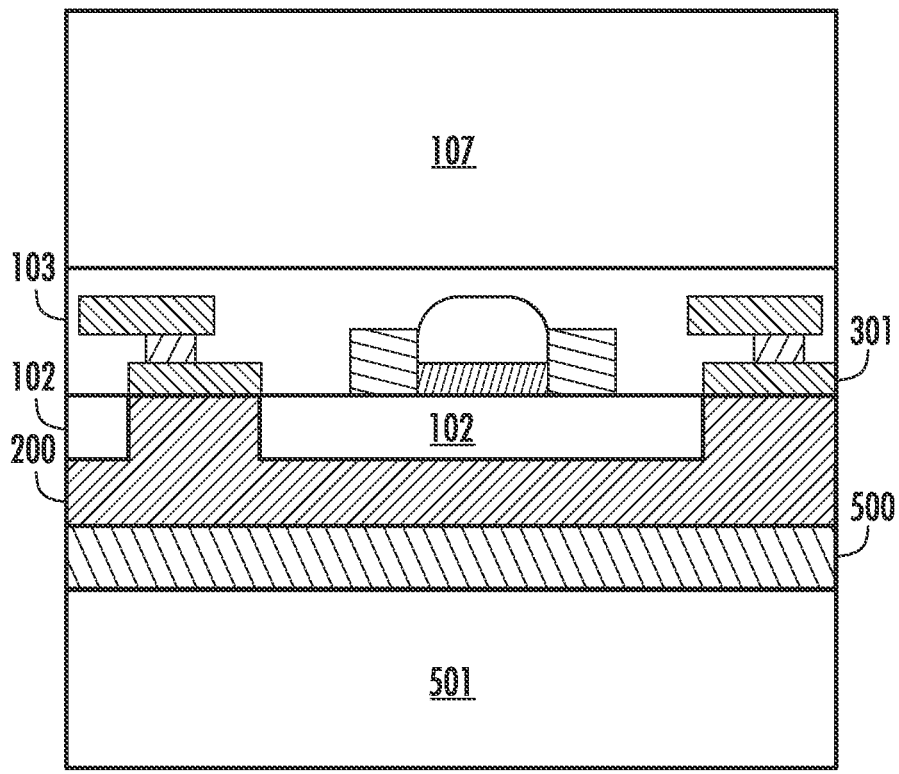
FIG. 6 illustrates a block diagram of an SOI structure having an attached back side thermal dissipation handle wafer, and a patterned insulator layer that is in accordance with the present invention.

Another SOI structure that is in accordance with the present invention can be described with reference to FIG. 6. FIG. 6 illustrates a specific embodiment of the invention combining aspects of a patterned insulator layer with the back side permanent handle described with reference to FIG. 5. In specific embodiments of the invention, permanent handle substrate layer 501 and permanent handle thermal dissipation layer 500 are disposed on the back side of the SOI structure after thermal dissipation layer 200 has been applied. In specific embodiments of the invention, the material used for permanent handle thermal dissipation layer 500 may be the same as the material used for thermal dissipation layer 200. Thermal dissipation layers 200 and 500 could be applied through sputtering or some other method. As described previously, thermal dissipation layer 200 is disposed in excavated oxide regions formed by the patterning of insulator layer 102. The specific embodiment illustrated in FIG. 6 displays the insulator layer 102 being patterned to expose lowest metal layer 301 in keeping with a specific embodiment of the invention previously described. Indeed, all of the patterning and thermal dissipation layer variants discussed above can be combined with the permanent handle concept described with reference to FIG. 5 to produce further embodiments of the invention with beneficial thermal dissipation and electrical characteristics. These embodiments will have the additional beneficial characteristic of being capable of front side bonding to circuitry in active layer 103.

Figure 7:
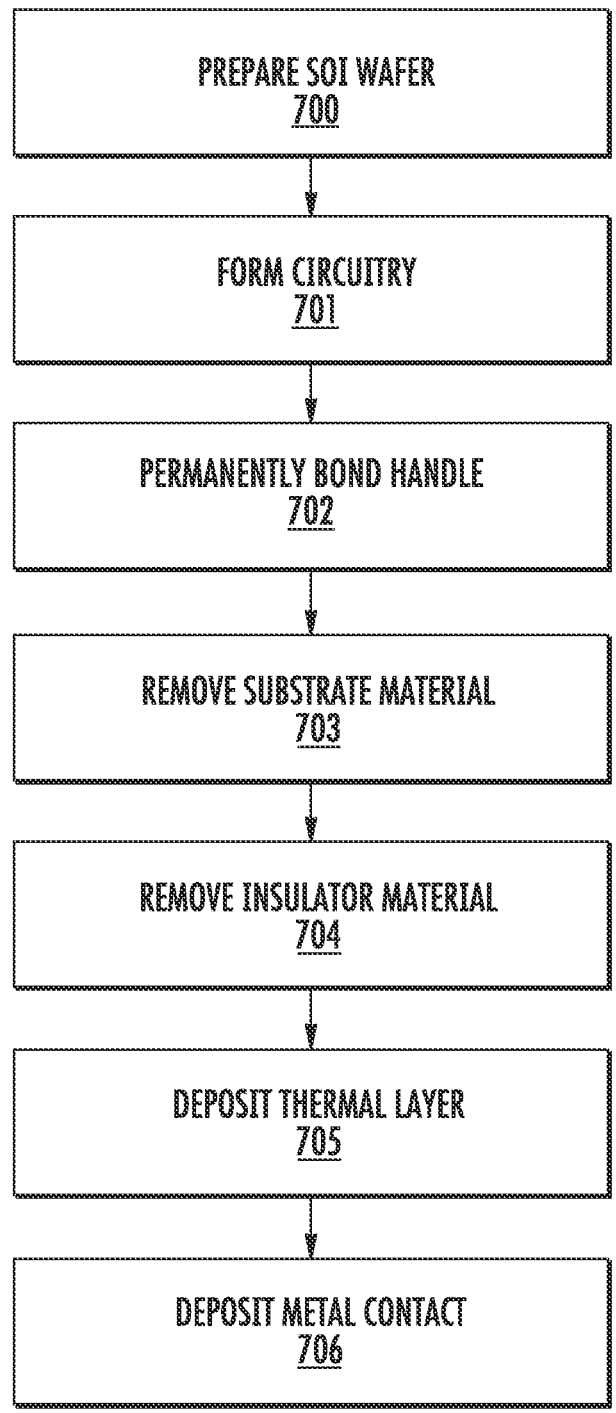
FIG. 7 illustrates a process flow chart of a method of fabricating an integrated circuit that has a thermal dissipation layer that is in accordance with the present invention.

Methods of producing an integrated circuit that are in accordance with the present invention can be described with reference to FIG. 7. In specific embodiments of the invention, a method for producing an integrated circuit begins in step 700 with the preparation of an SOI wafer for processing. This step can comprise the actual production of an SOI wafer consisting of a layer of active silicon above a silicon-dioxide insulator as produced using SIMOX or implant and cut methods. This step could also comprise the purchase of a prefabricated SOI wafer and its preparation for further processing.

In specific embodiments of the present invention, the preparation of SOI wafer in step 700 is followed in step 701 by forming active circuitry in the active layer of the SOI wafer. The circuitry formed during this step and in this layer can include but is not limited to technologies such as CMOS, BiCMOS, SiGe, GaAs, InGaAs, and GaN. The circuitry can comprise: various active devices such as diodes and transistors; various passive devices such as resistors, capacitors, and inductors; and routing circuitry such as metal wires and vias. Various photolithographic and chemical deposition steps can be conducted to formulate this circuitry.

In specific embodiments of the invention, the formation of active circuitry in step 701 is followed by back side processing of the SOI wafer. In specific embodiments of the present invention, back side processing begins with the attachment or permanent bonding of a second handle wafer to the SOI wafer above the active layer in step 702. Processes used to induce a permanent bond to a handle wafer include permanent organic or inorganic adhesives, oxide frit bonding, galvanic bonding, molecular fusion bonding, any form of electromagnetic bonding, and other known methods for producing permanent wafer bonds.

Following the permanent bonding of the handle wafer to the SOI structure, the SOI wafer substrate can be removed in step 703. The substrate could be removed using mechanical and chemical means independently or in combination. For example, mechanical grinding can be used to thin the substrate material from an original thickness of approximately 800 micro-meters ($\mu$m) to approximately 20 $\mu$m. If the substrate is silicon, the final thickness of substrate material may be removed with a wet etch such as KOH or TMAH. The final thickness of substrate material may also be removed using a dry plasma etch. The substrate can be removed with a high precision or etch rate ratio. The etch rate ratio refers to the ratio of the rate of desired substrate material that was removed from the back of the wafer to the rate of additional material that was removed which should not have been removed. In specific embodiments of the invention, the insulator layer is a buried-oxide that acts as an etch stop since the etch rate ratio can be extremely high for the removal of all the substrate up to the buried oxide.

In specific embodiments of the present invention, the removal of the SOI substrate in step 703 is followed by additional back side processing that can formulate any of the structures disclosed previously. In a specific embodiment of the invention, removal of the SOI substrate is followed by removal of the SOI insulator layer to form an excavated insulator region in step 704. As mentioned previously, the insulator layer may be removed altogether, merely thinned overall and left thinner than its original thickness, or may be removed in such a way that the excavated insulator layer forms any of several patterns as described above. These patterns can be formed using standard photolithographic techniques or selective chemical vapor deposition. Thinning the insulator layer must be done carefully to avoid damaging the active layer. Although only a mono-layer—on the order of 1 nm—of insulator material is needed, thinning may be limited by the uniformity of the original insulator. For example, traditional methods for insulator removal would not be able to leave a final layer of less than 5 nm if the initial layer had variations of greater than 5 nm to begin with. Additionally, these patterns can be configured to capitalize on beneficial tradeoffs in the degree to which circuitry in the active layer is shielded and the degree to which the resultant SOI structure efficiently dissipates heat as described above.

In specific embodiments of the invention, the removal of insulator material from the back side of the SOI wafer in step 704 is followed by the deposition of a thermal dissipation layer on the back side of the SOI wafer in the excavated insulator region in step 705. The deposition of this thermal dissipation layer can be conducted so as to create any of the structures disclosed previously. This step could likewise follow immediately after the removal of substrate material. In addition, this step could be conducted during the deposition of metal contacts where—for example—metal contacts were disposed in two or more steps, or after the deposition of metal contacts if holes were later opened in the thermal dissipation layer to expose the metal contacts for electrical connections. The addition of this thermal dissipation layer in step 705 could be achieved through chemical vapor deposition, sputtering, or some other method. In addition, a patterned deposition of the thermal dissipation layer in accordance with previously disclosed structures could be achieved through the use of standard photolithography processing or selective chemical vapor deposition. As described above, in specific embodiments of the invention, the thermal dissipation layer deposited in this step will be electrically insulating and thermally conductive.

In specific embodiments of the invention, the deposition of a thermal dissipation layer on the back side of the SOI wafer in step 705 is followed by passivating the interface states on the back of the SOI wafer. In embodiments of the invention where the entire insulator is removed in step 704, this can be highly advantageous because the thermal dissipation layer deposited in step 705 will likely have a high interface state density. The deposited films tend to have very high interface state densities unless they are annealed out at high temperatures above 800° C. Since this temperature is higher than standard wafers can handle after active circuitry has been developed, high temperature annealing is not an option at this juncture. However, the interface states can be passivated using a low-temperature anneal. In specific embodiments of the invention, this low-temperature anneal will take place in a range of temperatures from 400-450° C. and will be accomplished in a hydrogen-containing atmosphere of either pure hydrogen gas or forming gas. Forming gas is a non-explosive $N_2$ and $H_2$ mixture. This passivation step may result in a thermal dissipation layer that is much thinner than could otherwise be achieved. For example, this layer could be 5 nm to 20 nm thick and have a uniformity of about +/−5% using conventional chemical vapor deposition equipment or sputtering equipment. This step would therefore allow the deposition of a very thin insulating layer and therefore very efficient thermal conduction from the active layer. In these embodiments, the thermal dissipation layer would comprise a layer of efficiently deployed insulator material that enhanced the thermal dissipation performance of the SOI structure. In specific embodiments of the invention, a layer of highly thermally conductive material is deposited on the back of this thin layer of insulator material and the thermal dissipation layer comprises both the thin insulator material layer and the thermally conductive material layer.

In specific embodiments of the invention, the removal of the entire insulator layer in step 704 can be followed by the deposition of a thin layer of the same insulator material that was removed in step 704 followed by the low temperature anneal passivation step described in the previous paragraph. For example, the removed insulator material could be silicon-dioxide and the deposited and low-temperature annealed material could also be silicon-dioxide. Silicon-dioxide is an advantageous material to use because it has low interface state characteristics. The reason silicon-dioxide would be removed and then deposited is that the process of deposition and low temperature annealing could create a more uniform and thinner layer of insulator material than can be achieved through the partial etch-back of the original layer using methods disclosed above.

In specific embodiments of the invention, the deposition of thermal dissipation layer on the back side of the SOI wafer in step 705 is followed by the removal of the thermal dissipation layer in selected areas to allow electrical contact to active circuitry in the active layer during subsequent processing. In one embodiment, the excavation of portions of the thermal dissipation layer may be located where regions of the lowest level of metal are present to expose that metal for electrical contact. Alternatively, the thermal dissipation layer may be selectively removed under active silicon regions to allow direct contact to active structures. In addition to the thermal dissipation layer, other dielectric layers may be required to be removed to expose various conductors for electrical contact. The removal of the thermally conductive layer may be selectively accomplished using the well-known means of photolithography and dry or wet etch using suitable chemistries.

In specific embodiments of the invention, the removal of areas of the thermal dissipation layer from the back side of the SOI wafer is followed by the deposition of metal contacts in step 706. These metal contacts are deposited in a first portion of the excavated insulator region formed in step 704 or step 705. The metal contacts are able to rapidly dissipate heat from the active circuitry. In specific embodiments of the invention, the metal contacts may provide both thermal channels for heat dissipation from active circuitry as well as contacts for signal or power connections to external devices. These metal contacts may comprise ball bonds, solder bumps, copper posts, or other die contact materials. The metal contacts could additionally be configured to attach to a circuit board, or a low-temperature co-fired ceramic substrate. The structure produced in this step will thereby have contacts to the SOI structure's active layer on the bottom side of the structure, which is the opposite orientation in standard SOI devices.

Figure 8:
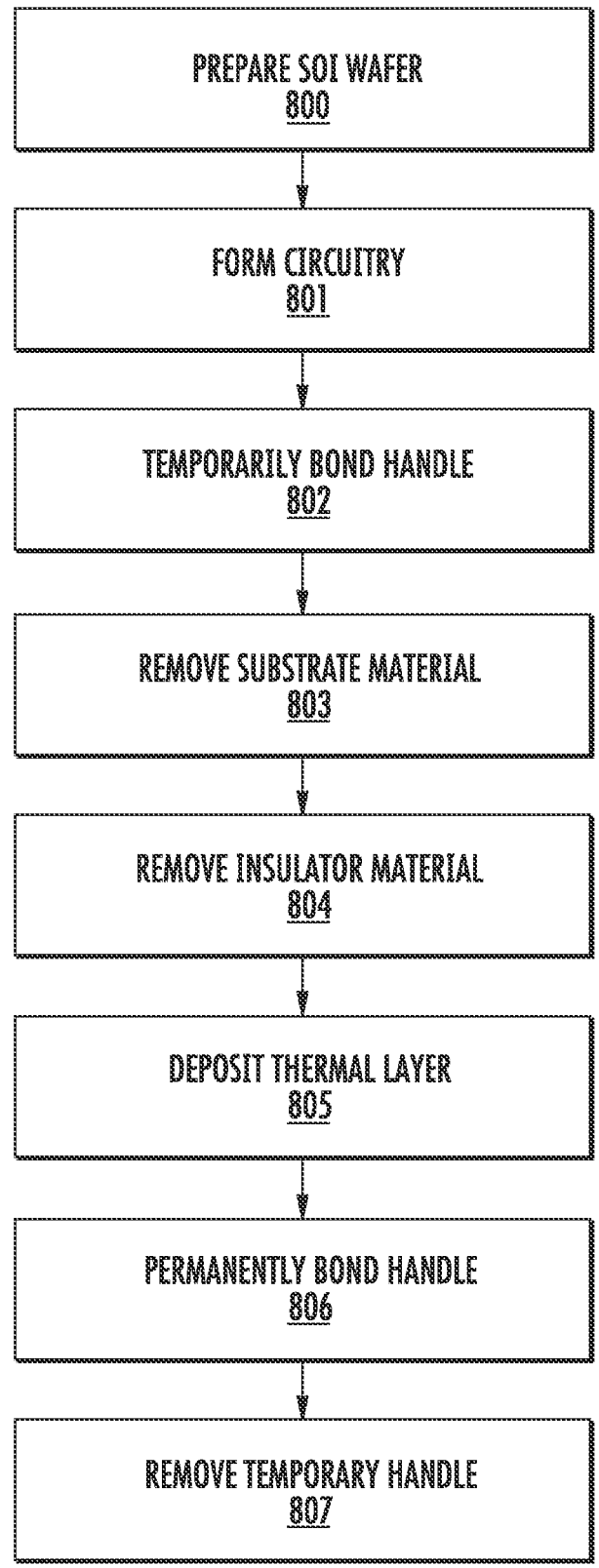
FIG. 8 illustrates a process flow chart of a method of fabricating an integrated circuit that has a thermal dissipation layer using a temporary handle wafer that is in accordance with the present invention.

Methods of producing an integrated circuit that are in accordance with the present invention can be described with reference to FIG. 8. In specific embodiments of the invention, a method for producing an integrated circuit begins in step 800 with the preparation of an SOI wafer for processing and continues with the formation of circuitry in the active layer of the SOI wafer in step 801. Steps 800 and 801 can be performed as described previously with reference to steps 700 and 701 respectively. Step 802 can comprise bonding a handle wafer to a top side of the active layer of the SOI wafer. The handle wafer could be bound temporarily to the active layer. Processes used to induce a temporary bond to a handle wafer include adhesives such as Brewer Science HT 10.10, 3M's WSS (Wafer Support System), HD Micro polyimide, and TMAT. This handle wafer could comprise an insulator layer which would be bonded to the active silicon, and disposed on a substrate. At this point, the active circuitry would therefore be sandwiched between two insulator layers. Alternatively, the handle wafer could comprise a conductive or semi-conductive material. Following the temporary bonding of the handle wafer in step 802, steps 803, 804, and 805 can all be performed as previously described in steps 703, 704, and 705 respectively.

In specific embodiments of the present invention, deposition of the thermal dissipation layer in step 805 can be followed by the attachment or permanent bonding of a second, permanent handle wafer to the SOI structure below the active layer in step 806. The effect of this back side processing step is to alter the direction from which contacts can be made to active circuitry in the SOI structure. Once this second handle wafer is permanently bonded to the back side of the SOI wafer, the original handle wafer can be easily removed in step 807 due to the fact that it was bonded using a temporary and easily reversible process. Processes used to induce a permanent bond to a top side handle wafer include permanent organic adhesives, oxide frit bonding, galvanic bonding, molecular fusion bonding, any electromagnetic bonding method, and other known methods for producing permanent wafer bonds. Some bonding methods, such as molecular fusion bonding, may require a high degree of flatness to both surfaces being bonded. If the insulator material was selectively removed, that may introduce non-planarity to the surface of the wafer which makes bonding more difficult. In that case, chemical-mechanical polishing may be used to planarize the surface of the wafer prior to the bonding step to improve the efficacy of the bonding.

The structure produced in step 806 will have the SOI structure's active layer exposed on its top side and further processing can allow direct connection to active circuitry from the top side. The second, permanent, handle wafer that is bonded in step 806 can consist entirely of an electrically insulating, but thermally conducting material. In addition, the second handle wafer could consist of such a material disposed on a substrate material. This second configuration could save costs as the substrate material will provide the necessary stability to the final SOI device while not using as much of what may be a very costly thermally conductive material. It is possible for the thermally conductive material on the second, permanent, handle wafer to consist of the same material deposited to form the thermal dissipation layer in step 805. Alternatively, the permanent handle wafer that is bonded in step 806 can consist of a conductive material or a semiconductor material, such as silicon or high-resistivity silicon.

Back Side Strain Inducing Layer

Embodiments of the present invention provide for the production of active devices in SOI structures having strain inducing materials in close contact to their channels. Embodiments of the present invention allow for the introduction of such strain inducing materials at a later stage in the device fabrication process than the usual stages at which strain inducing layers are applied. This allows for the increased effectiveness of the strain inducing layers while at the same time decreasing the risk of damage to the SOI structure during the intermittent manufacturing stages. In addition, devices with the aforementioned benefits can be manufactured in accordance with the present invention with very little modification to manufacturing processes that are used most often in the semiconductor industry. This is a huge advantage given that compatibility with existing manufacturing processes avoids the need for the nearly insurmountable fixed production costs investments that can face novel semiconductor solutions. Embodiments of the invention achieve this result through the utilization of back side processing, the possible removal of portions of the SOI insulator layer, and the deposition of strain inducing layers in variant configurations on the back side of the SOI structure.

The introduction of mechanical tensile or compressive strain in the material comprising the channel of an active device can increase the mobility of the charge carriers in such active device. In general, inducing tensile strain increases the mobility of electrons and inducing compressive strain increases the mobility of holes. An n-type active device, such as an n-type metal-oxide semiconductor (NMOS) will therefore be able to operate at a higher frequency if tensile strain is induce in its channel because the charge carriers in an NMOS device are electrons. Likewise, a p-type active device, such as a p-type metal-oxide semiconductor (PMOS) will be able to operate at a higher frequency if compressive strain is induced in its channel because the charge carriers in a PMOS device are electrons.

Figure 9:
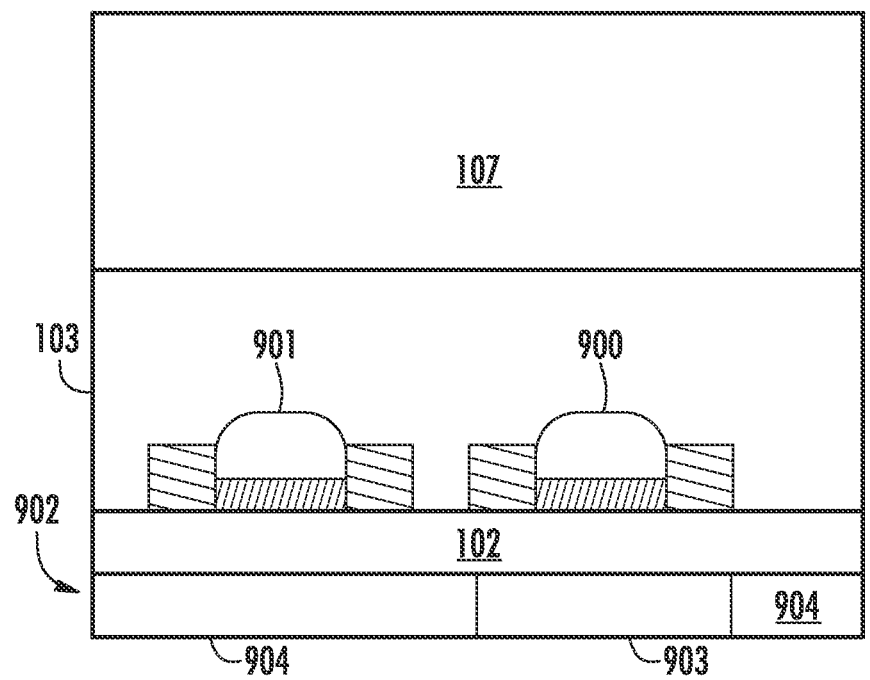
FIG. 9 illustrates a block diagram of an SOI structure having a patterned strain layer that is in accordance with the present invention.

An SOI structure that is in accordance with the present invention can be described with reference to FIG. 9. FIG. 9 illustrates an SOI structure wherein an original SOI wafer comprising active layer 103, insulator layer 102, and a substrate has been attached to a handle wafer 107 and has undergone back side processing to remove its substrate. Circuitry has already been generated in active layer 103 including an n-type active device such as NMOS 900, and a p-type active device such as PMOS 901. In addition, a strain inducing layer 902 is present on the back of insulator layer 102.

The configuration illustrated in FIG. 9 has certain advantageous characteristics as compared to the typical approach for inducing strain in a semiconductor device. Stress in a device can cause problems such as wafer warpage along with the benefits it produces, so it is desirous to keep the overall amount of stress induced in the semiconductor structure limited and targeted as specifically as possible. Since the efficacy of a strain inducing layer increases as the distance between the region to be strained and the straining region decrease, the overall strain induced in the semiconductor is limited while achieving the same beneficial channel strain by placing the stain inducing layer as close to the channels of the active devices as possible. This is problematic from the viewpoint of a top processing manufacturing approach because the lowest layers must generally be deposited first. As such, the strain inducing layer is usually deposited above the gate of FET devices and is therefore located a substantial distance from the channel. Also, non-planarity in the straining layer is introduced through the patterning of the gate, making the effect of the strain-inducing layer dependent on geometric effects such as length and width of the FET devices. In addition, the semiconductor device undergoes further processing steps after deposition of the straining layer involving extremely high temperatures in the range of 600-1050° C. This necessity has two debilitating effects on the semiconductor device. First, the strain induced by the strain inducing layer may be decreased during high temperature annealing which is contrary to the overall purpose of the strain inducing layer. Second, the strain inducing layer may cause plastic deformation of the active layer and wafer warpage which may result in silicon crystal defects such as slip and dislocation generation which will significantly decrease the electrical performance and product yield of a resulting device. In contrast, deposition of the strain inducing layer using back side processing in accordance with the present invention allows the strain inducing layer to be deposited in close contact to the channels of active devices after the active layer has been fully processed, thus avoiding the problems associated with the introduction of stress at an early stage.

Figure 11:
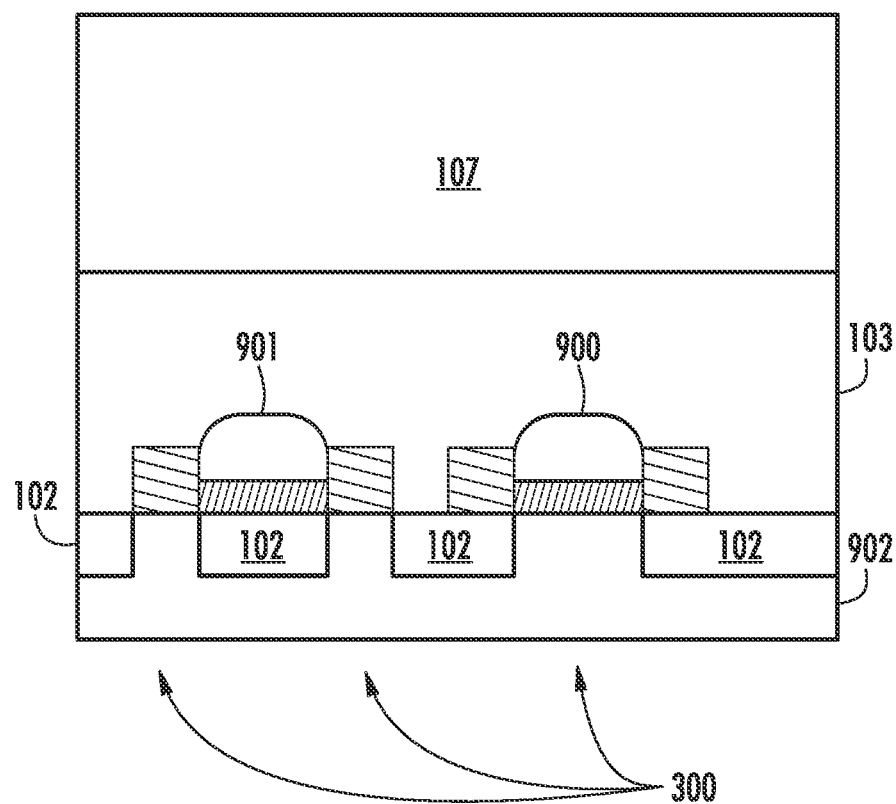
FIG. 11 illustrates a block diagram of an SOI structure having a patterned insulator layer and a strain inducing layer that is in accordance with the present invention.

In specific embodiments of the invention, the strain inducing layer is applied using lithography processes or other manufacturing methods—such as those discussed below with reference to FIG. 11—that allow for the patterned deposition of strain inducing layers. FIG. 9 illustrates a particular embodiment where strain inducing layer 902 has been patterned to comprise a tensile strain layer 903, and a compressive strain layer 904. In specific embodiments of the present invention, these two portions of strain inducing layer 902 can be formed using different materials that have a tendency to produce either a tensile or compressive strain on active layer 103. Materials that can induce tensile strain include silicon nitride, and aluminum nitride. Materials that can induce compressive strain include silicon nitride, aluminum nitride, and diamond-like carbon. The same materials can induce either compressive or tensile strain depending on the conditions under which the material is deposited. In specific embodiments of the invention, the two portions of strain inducing layer 902 can be formed by depositing the same material under different conditions. Several materials can be applied wherein the strain inducing characteristic of the material can be controlled by modulating the deposition conditions. For example, silicon nitride or aluminum nitride deposited using chemical vapor deposition under different conditions can produce either tensile or compressive strain. In specific embodiments of the present invention, a tensile strain layer 903 can be deposited over a region of the SOI structure having n-type active devices such as NMOS 900, and a compressive strain layer 904 can be deposited over a region of the SOI structure having p-type active devices such as PMOS 901. Thereby, the carrier mobility of both devices can be efficiently enhanced.

In specific embodiments of the invention, a uniform strain inducing layer is applied to the bottom of the SOI structure during back side processing. These embodiments are of particular utility in situations where a specific-carrier-type active device predominates the circuitry in active layer 103. For example, if the active devices in active circuit layer 103 were predominately NMOS transistors, a uniform tensile strain layer could be applied to the back side of the SOI structure. Thereby, the NMOS transistors would be enhanced and the potential debilitating alteration in the mobility of carriers in any PMOS transistors would be outweighed by the benefits provided by the enhancement of the more numerous NMOS transistors.

In specific embodiments of the invention, the strain inducing layer or strain inducing layers are applied directly to the back of active layer 103. This is achieved by an additional back side processing step of removing insulator layer 102 before strain inducing layer 902 is deposited. These embodiments share the beneficial characteristic of allowing for deposition of the strain inducing layer at a later stage in the semiconductor device processing sequence. However, in these embodiments the strain inducing layer is even closer to active layer 103. Therefore, less overall stress is required which can enhance the electrical characteristics and yield of the resulting semiconductor device while still enhancing the mobility of charge carriers in the channels of its active devices. In specific embodiments of the invention, when strain inducing layer 902 is deposited directly on active layer 103, the strain inducing layer 902 is comprised of electrically insulating materials to preserve the beneficial characteristics of SOI structures. Materials that both induce strain and can act as electrical insulators include silicon nitride, aluminum nitride, silicon carbide, and diamond-like carbon.

Figure 10:
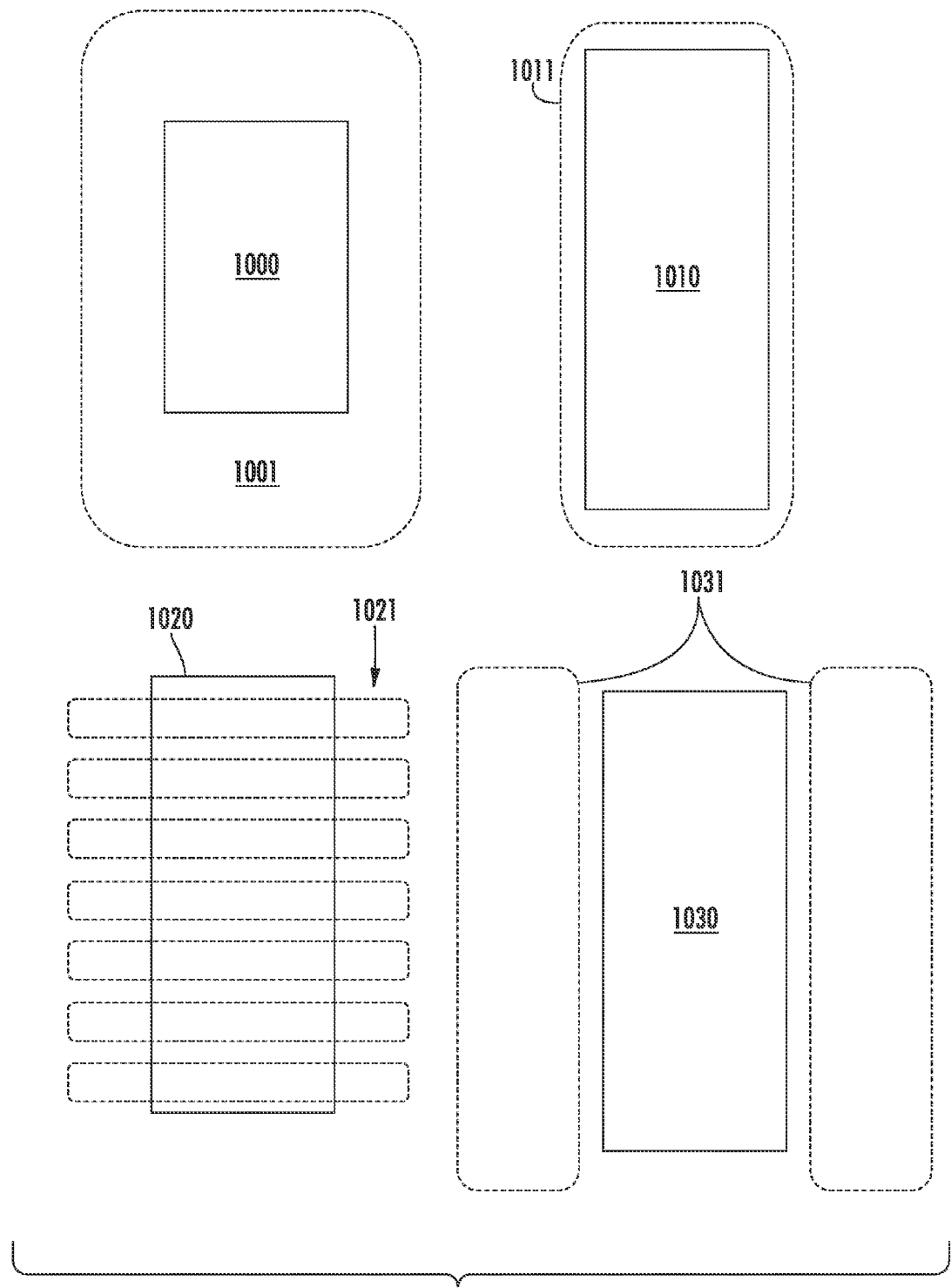
FIG. 10 illustrates a block diagram of various strain layer patterns that can be used in accordance with the present invention.

In specific embodiments of the present invention, different patterns are applied to induce strain in active layer 103. These patterns can create bi-axial strain or uni-axial strain in a direction parallel or perpendicular to the flow of charge carriers. These patterns can be formed by the application of multiple at-least-partially vertically coextensive strain inducing layers as described above. Likewise, these patterns can be formed by the application of a strain inducing layer deposited in an excavated insulator region as described above. Variant patterns that can induce tensile or compressive strain can be described with reference to FIG. 10. Gate 1000 is surrounded by strain inducing layer 1001. If strain inducing layer 1001 is a tensile stress inducing layer this pattern will produce a bi-axial tensile strain in the channel below gate 1000. If strain inducing layer 1001 is a compressive strain inducing layer this pattern will produce a bi-axial compressive strain in the channel below gate 1000. Gate 1010 is surrounded by strain inducing layer 1011. Gate 1010 has a large ratio of width over length. As such, the application of strain inducing layer 1011 will induce a predominately uni-axial strain in the channel below gate 1010 that is parallel to the flow of charge carriers through the channel and is either compressive or tensile based on whether strain inducing layer 1011 is correspondingly compressive or tensile. Gate 1020 is over strain inducing layer 1021. This pattern will induce a predominately uni-axial strain in the channel below gate 1020 that is perpendicular to the flow of charge carriers through the channel and is either compressive or tensile as strain inducing layer 1021 is correspondingly compressive or tensile respectively. Finally, gate 1030 is surrounded by strain inducing layer 1031. The effect of this pattern will be to create the opposite strain that would be induced by layer 1011 if the same type of material was used for stain inducing layers 1031 and 1011. For example, if strain inducing layer 1031 was tensile inducing, then a compressive strain would be induced in the channel below gate 1030. Likewise, if strain inducing layer 1031 was compressive, then a tensile strain would be induced in the channel below gate 1030.

An SOI structure that is in accordance with the present invention can be described with reference to FIG. 11. FIG. 11 illustrates an SOI structure comprising active layer 103 wherein insulator layer 102 has been removed according to a specific pattern to form excavated insulator region 300, and produce a desired distribution of straining force in active layer 103. In specific embodiments of the invention, both tensile and compressive strain can be induced in active layer 103 using the same material for all of strain inducing layer 902. As described previously with reference to FIG. 10, the same material can be used for strain inducing layers 1011 and 1031 to induce opposite typed strains in the channels below gates 1010 and 1030. As illustrated in FIG. 11, excavated insulator region 300 could expose the channel of n-type active devices such as NMOS 900, and be patterned around the channel of p-type active devices such as PMOS 901. In this case, strain inducing layer 902 could be a uniform tensile strain inducing layer which would act in tandem with the pattern of excavated insulator region 300 to enhance the mobility of both the electrons in NMOS 900 and the holes in PMOS 901. In specific embodiments of the invention, the polarity of the pattern and the strain types of the deposited material are swapped as compared to the previous embodiments, and the same dual enhancement effect would result.

In specific embodiments of the invention, excavated insulator region 300 could be formed to only expose a subset of active devices in active layer 103. For example, excavated insulator region 300 is removed in a pattern which only exposes the channel of n-type devices such as NMOS 900 and a tensile strain inducing layer is then deposited on the back of the SOI structure. Likewise, in specific embodiments of the present invention, the polarity of the pattern and the strain type of the deposited material could be swapped as compared to the previous embodiment. In specific embodiments of the invention, the strain inducing layer underlying the remaining insulator region could be removed through an etching procedure. Although in these embodiments only one type of device will be strained this will still lead to advantageous performance, especially in designs that are more heavily performance-dependent on a certain type of semiconductor material.

In specific embodiments of the present invention the material in contact with the back side of the SOI structure that induces strain in the active devices can also serve as a thermal dissipation layer. As such, any thermal dissipation layers in the first section of this description could be replaced with a layer that additionally induces strain. In addition, combinations of this embodiment with those embodiments wherein the strain inducing layer is patterned to be in contact with sources of heat such as the channels of active devices produce advantageous results. In a specific embodiment, the strain inducing layer will be deposited on the channels of active devices and will serve as both a strain and thermal dissipation layer, and it will also isolate the device in the way that a standard insulator layer does for SOI devices. Materials that can provide all of these advantageous characteristics by being electrically isolating, thermally conductive, and strain inducing include aluminum nitride, silicon carbide, and diamond-like carbon. In a specific embodiment of the invention, insulator layer 102 can be completely removed and replaced with a patterned thermal spreading layer that can dissipate heat while at the same time providing a pattern for a strain inducing layer as described with reference to FIG. 10.

Figure 12:
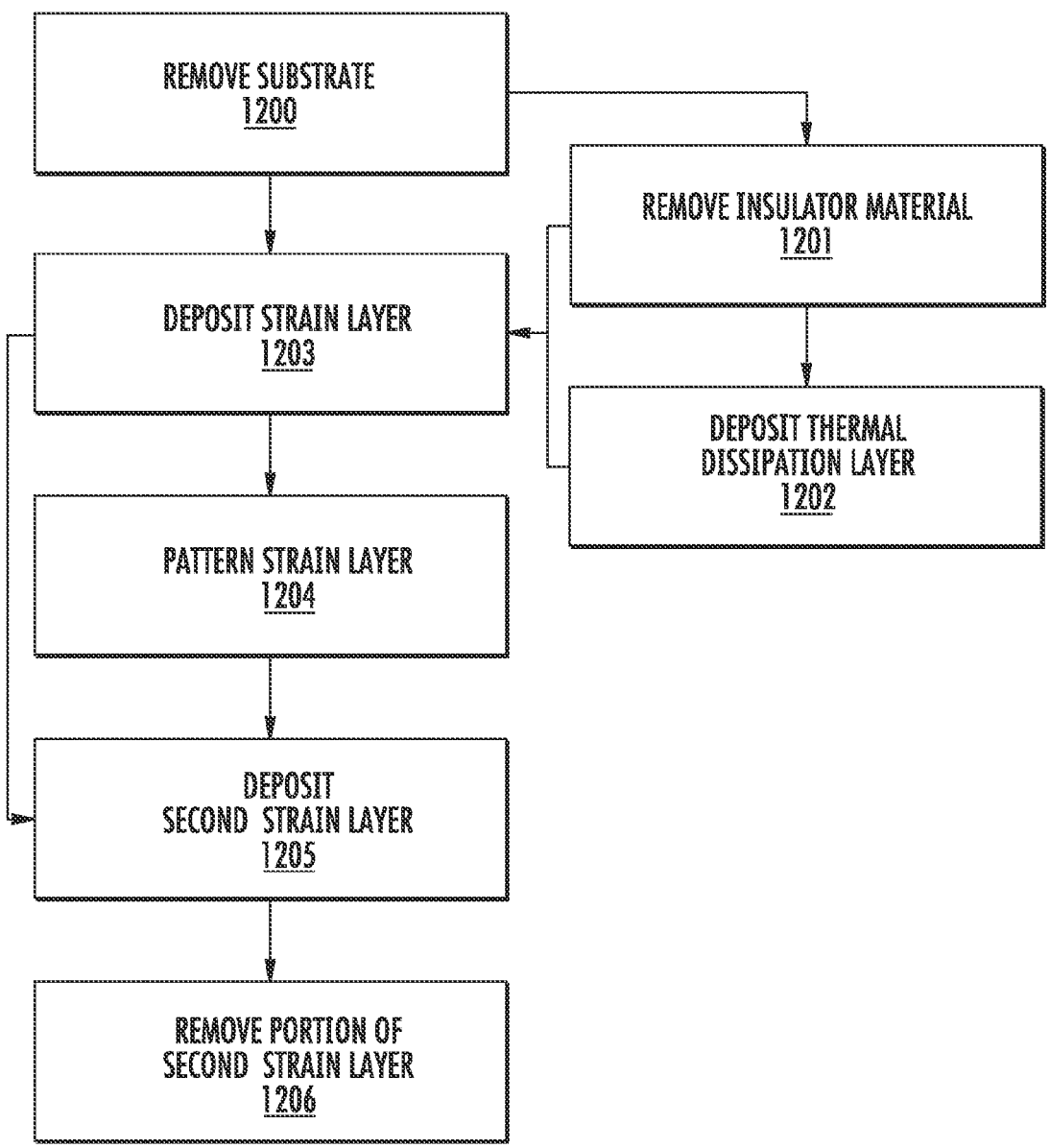
FIG. 12 illustrates a process flow chart of a method of fabricating an integrated circuit having a strain inducing layer that is in accordance with the present invention.

Methods of producing an integrated circuit that are in accordance with the present invention can be described with reference to FIG. 12. In step 1200 the substrate is removed from the back of an SOI structure using back side processing. In specific embodiments of the invention, the SOI structure has already undergone significant processing such that the circuitry in the active layer of the SOI structure is nearly complete. Methods for the removal of substrate in step 1200 are the same as those mentioned with reference to step 703 in FIG. 7. In specific embodiments of the invention, step 1200 is followed by the deposition of a strain inducing layer on the back side of the SOI structure in step 1203. The deposited strain inducing layer can be deposited over the entire back surface of the SOI layer through sputtering, chemical vapor deposition, or any other method. The strain inducing layer can induce either a compressive or tensile strain. Also, the deposited layer can be patterned using lithography or some other method to deposit a first strain layer in one portion in step 1203 and then another strain layer in step 1205. In this case, a multi-portion strain inducing layer would be formed which could have a tensile inducing portion and a compression inducing portion. In a specific embodiment of the invention, this multi-portion strain inducing layer could in fact be formed using the same material in step 1203 and 1205 in combination with different processing conditions for each of the two steps. As described above, materials such as silicon nitride exert either a tensile or compressive stress depending upon the conditions under which they are applied.

In specific embodiments of the invention the removal of substrate material in step 1200 is followed by the removal of insulator material in step 1201. This removal can involve any of the methods discussed with reference to step 704 in FIG. 7. In specific embodiments of the invention, step 1201 can be followed by the deposition of a thermal dissipation layer in step 1202. This deposition can involve any of the methods discussed with reference to steps 705 and 706 in FIG. 7. In specific embodiments of the invention step 1201 can instead be followed by the deposition of a strain inducing layer in step 1203. In specific embodiments of the invention where the strain inducing layer and the thermal dissipation layer are one and the same, there will be no difference between these two steps. In specific embodiments of the invention, the insulator layer removal in step 1201 can completely remove the insulator material from the back of the SOI structure. If this step is followed by the deposition of strain layer 1203 the resultant SOI structure will comprise a strain layer deposited directly on the back of the active layer.

In specific embodiments of the invention, the insulator layer removal in step 1201 can remove the insulator material in certain patterns as described above. This can be followed by deposition of a strain layer in step 1203 so that the strain layer is deposited in an excavated insulator region formed in step 1201. For example, the insulator material could be removed only under those portions of the circuit on which a strain was meant to be induced such as only under the n-type devices. In that case the strain inducing layer would be tensile and only the n-type devices would be beneficial strained while the p-type devices were left in a nominal state. As another example, the insulator material could be left below the n-type device channels, and in a corresponding negative pattern below the p-type device channels so that a single strain inducing layer could produce both tensile and compressive strains on the active layer as needed. The patterned removal of insulator material in step 1201 could also be followed by step 1203 and 1205 in sequence to deposit different kinds of strain inducing layers in different portions of the excavated insulator region as described above.

In specific embodiments of the invention, the deposition of a strain inducing layer on the back side of the SOI structure in step 1203 is followed by the patterned removal of portions of the deposited strain inducing layer in step 1204. This step will therefore form an excavated strain layer region. In step 1205, a second strain layer is deposited on the back side of the SOI structure. As a result, this second strain layer will fill in the excavated strain layer region. In step 1206, the additional strain layer that did not fill in the excavated strain layer region can be removed to form an even back surface for the SOI structure. This approach has certain advantageous aspects as compared to other embodiments because only the removal of the strain layer in step 1204 needs to be patterned. The removal of the second strain layer in step 1206 can involve mechanical grinding to a uniform level or a controlled etch aided by a difference in the chemical compositions of the first and second strain layers. In addition, the actual deposition of strain inducing layers can be uniform in both steps 1203 and 1205. Considering the fact that some forms of deposition such as chemical vapor deposition are not always amenable to detailed lithographic patterning, this approach is advantageous in that it can achieve detailed patterning in a more efficient manner.

Back Side Strain Inducing Layer Topology

The relative configuration of the strain layers and the devices in the active layer 103 affects device performance. It was noted previously that the efficacy of the strain layer increases with the proximity of the strain layer to the active layer such that placing the strain layer on the back side of the wafer after layer transfer provides significant benefits over approaches in which the strain layer is overlain over the active devices from the top side. However, the interplay between the strain layer, the pattern on which the strain layer is deposited, and the active layer is influenced by numerous other factors than just the proximity of the active layer and the strain layer.

As the focus of the following disclosure is the relationship between the strain layer, pattern, and active layer, the materials providing the pattern will be referred to as "the patterned layer" despite the fact that the layer may be formed by multiple physical layers of material and can be formed using any of the methods described above. For example, as described above, the final back side strain layer can be deposited on a patterned layer that is itself deposited on the back of insulator layer 102, on a patterned layer that is deposited directly on the back of active layer 103 after insulator layer 102 has been removed, or on the back of insulator layer 102 after insulator layer 102 has been patterned or thinned. The patterned layer can be any appropriate thickness, width, or alignment relative to the active layer. In situations where the patterned layer includes additional material deposited on the back side of the device, the additional material can be a semiconductor, metal, or insulator material. As another specific example, the patterned layer could be formed using the methods described in commonly assigned U.S. patent application Ser. No. 14/453, 595 which is incorporated by reference herein.

The following discussion of the relationship of the configuration and composition of the pattern layer and induced strain in the active devices applies to any of the patterns and strain layers discussed above with reference to FIGS. 9-12 as may be appropriate. In particular, the patterned layer can be aligned with the channels of the active devices in the active layer and can have either polarity (i.e., a positive pattern could have the aligned pattern structure present below the gate fingers, whereas a negative pattern could have the pattern present everywhere except below the gate). The strained layer can be uniform or patterned, any appropriate thickness, fabricated with a dielectric material, and can have compressive (negative) or tensile (positive) intrinsic stress. For n-type devices, a positive pattern could be used with a tensile strain layer or a negative pattern with a compressive strain layer. For p-type devices a negative pattern could be used with a negative strain layer or a positive pattern could be used with a positive strain layer. As another specific example, the patterned layer could be a layer of insulator material deposited on the back side of the original SOI wafer after the buried insulator was thinned. The benefit of this approach would be that the original insulator could be kept in place below the delicate channel region of the device while the strain layer could still be placed in close proximity to the active region. The efficacy of the strain layer decreases logarithmically with the thickness of the buried oxide in such situations. This relationship holds true for buried insulator thicknesses in the range of 10 nm-5 µm. In situations in which the buried insulator is left in place and the patterned layer is formed on the back of the buried insulator layer, it is generally desirable to assure that the buried insulator is less than 1 µm thick.

Additional conventions that will be useful for describing the relationship of the strain layer pattern and active layer can be described with reference to semiconductor structure cross section 1300 in FIG. 13. Cross section 1300 includes active layer 1301 corresponding to active layer 103 in the previous figures. However, active layer 1301 is inverted because the wafer is undergoing back side processing. As such, a handle wafer, that is not shown, will be located on the opposite side of the active layer from the back side when such processing is conducted. Active layer 1301 is in contact with patterned layer 1302 in pattern region of patterned layer 1302 and strain layer 1303 in an excavated region of patterned layer 1302. Strain layer 1303 is located in the excavated region and on the patterned region.

A salient feature of active layer 1301 in cross section 1300 is active device 1304. Active device 1304 can be a field effect transistor. Channel region 1306 can be flanked by a source and drain as shown. Notably, portion 1305 of patterned layer 1302 remains in place over the channel region 1306 of active device 1304 such that the channel region lies completely within a lateral extent of the patterned region. Channel region 1306 can extend into and out of the plane of cross section 1300 and can be a single finger of a multi-finger transistor. A cross section of each finger could be represented by cross section 1300. In such a situation, the patterned layer 1302 is overlaid with the gate of the transistor with identical location, length, and spacing along the fingers. The pattern of patterned layer 1302 could be inverted such that the excavated regions of patterned layer 1302 still contained patterned layer material and regions such as that occupied by portion 1305 would be excavated. As described above, such approaches would allow an opposite strain polarity to be exerted on active device 1304 with the same type of strain layer material 1303.

Figure 13:
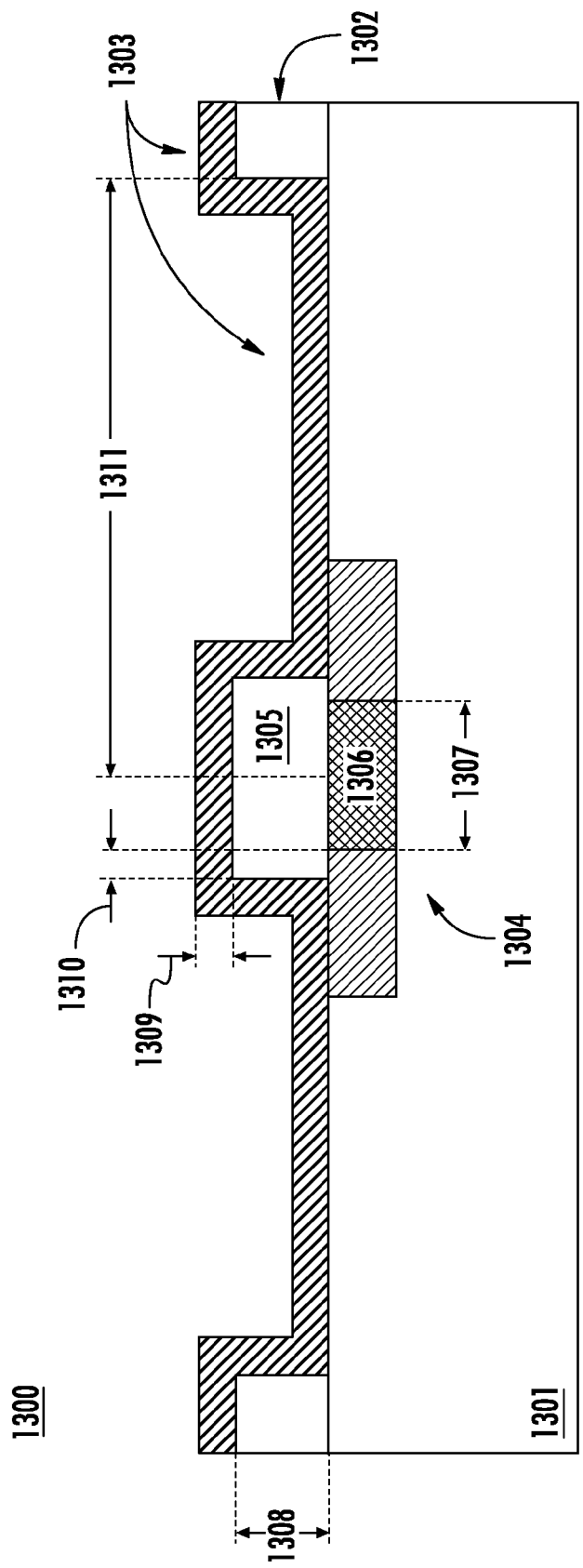
FIG. 13 illustrates a block diagram of a semiconductor structure having a back side strain layer that is in accordance with embodiments of the present invention.

FIG. 13 is marked with several dimensions that are useful for describing the relationship of patterned layer 1302 and active layer 1301. Cross section 1300 is normal to the width of active device 1304, such that dimension 1307 defines the length of the transistor channel. Dimension 1308 defines the thickness of the patterned layer which can also be referred to as the height of the pattern. The patterned layer height is equal to the depth of the excavated region. Dimension 1309 defines the thickness of the strain layer. Strain layer 1303 has a front surface in contact with patterned layer 1302 and a back surface. The thickness of the strain layer 1303 is equal to the minimum distance between the back and front surfaces. Dimension 1310 defines the distance by which portion 1305 of the patterned layer 1302 extends beyond the length of channel 1306. As illustrated, this dimension is generally not greater than the lateral extent of the source or drain such that the source and drain each lie only partially within a lateral extent of the patterned region 1302. To more generally cover the situations in which the pattern is negative of that of what is shown in cross section 1300, dimension 1310 can define half the distance between two channel-localized transitions in the pattern and the length of the channel. Dimension 1311 helps define a distance by which the locally excavated region extends beyond the periphery of active device 1304 and is measured from the center of the channel. Dimension 1311 is not relevant for situations in which the pattern is negative of that shown in cross section 1300 because regardless of the pattern's polarity, the excavated region will not extend beyond the illustrated outer boarders of patterned layer 1302.

Dimension 1310 is of particular importance in terms of the interplay of the strain layer 1303 to the degree of strain delivered to the active device 1304. Edge effects that occur at the point where the pattern of the patterned layer 1302 transfers from an excavated to a patterned portion significantly decrease the strain induced in the active layer 1301 by strain layer 1303. Therefore, the point at which the pattern transitions needs to be kept outside of the channel region 1306, and dimensions 1310 should be nonzero. However, the benefit of placing these edge effects outside of channel region 1306 decrease asymptotically with an increase in dimension 1310. In addition, increasing dimension 1310 too much will diffuse the strain imparted by any given combination of a patterned layer and strain layer to both the channel and the source and drain regions of the device. Although strain that can beneficially effect the channel does not have any major deleterious effects on a localized level when it is applied to the source and drain of a device, the overall strain in the wafer can cause specific problems such that a more specific application of strain to the channel is usually desirable. Therefore, minimizing dimension 1310 to a reasonable level such as 0.25 µm is advisable.

Figure 14:
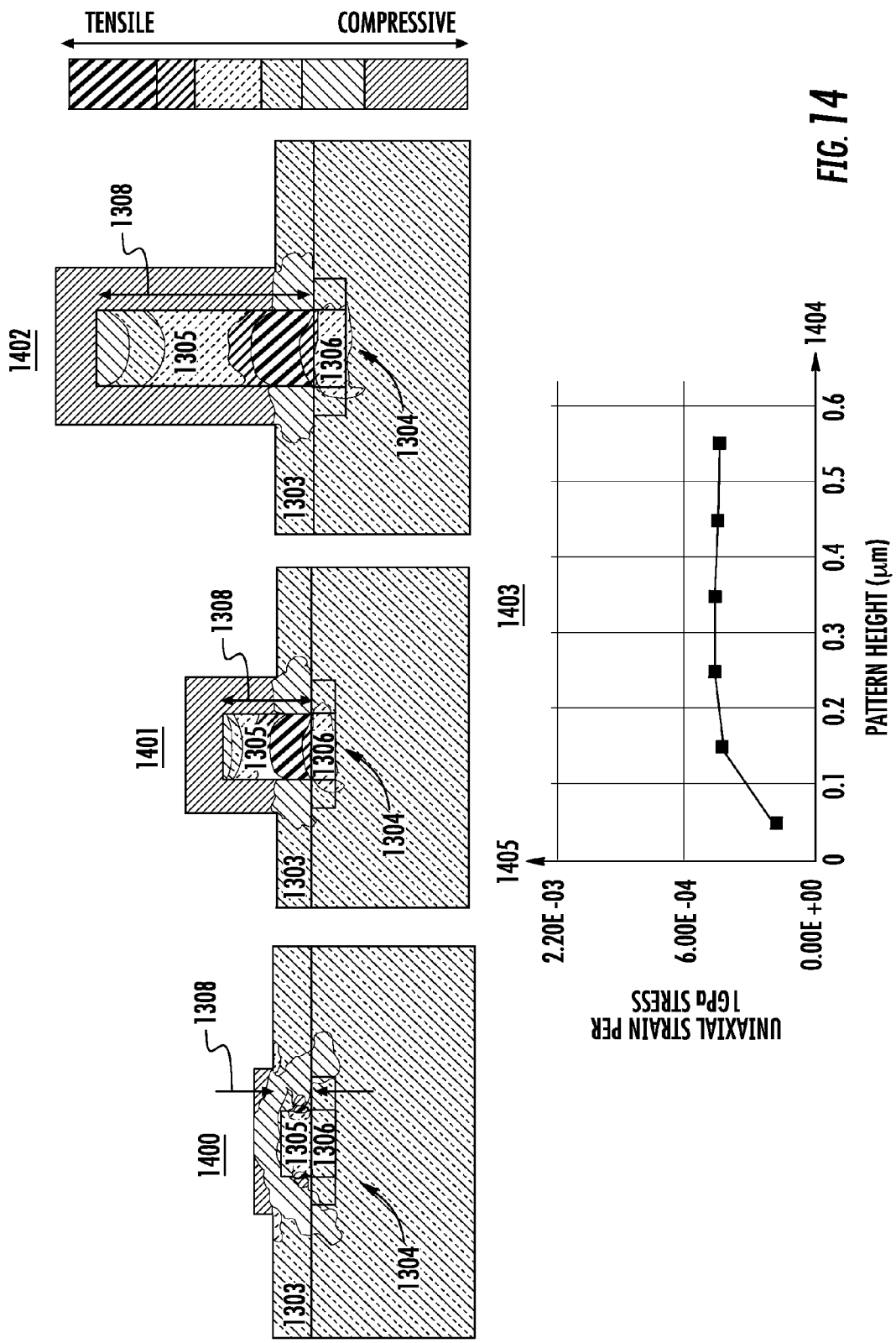
FIG. 14 illustrates a collection of strain diagrams and a corresponding chart of pattern height against uniaxial strain in the channel of the semiconductor structure from FIG. 13 that is in accordance with embodiments of the present invention.
Figure 15:
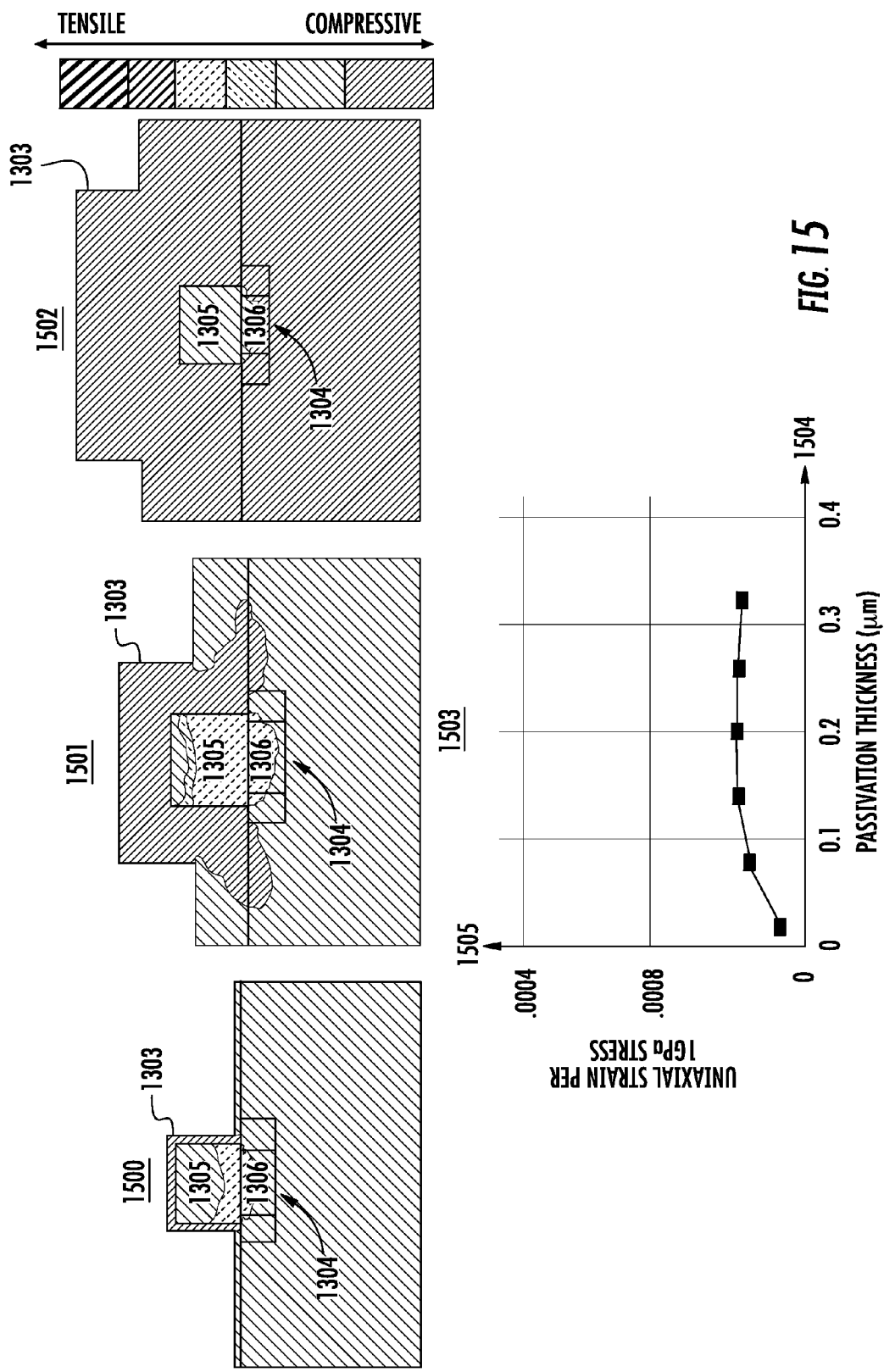
FIG. 15 illustrates a collection of strain diagrams and a corresponding chart of passivation thickness against uniaxial strain in the channel of the semiconductor structure from FIG. 13 that is in accordance with embodiments of the present invention.

FIGS. 14 and 15 display simulation results for the strain imparted to active device 1304 by patterned layer 1302 and strain layer 1303. The specific pattern simulated is that shown in cross section 1300 where pattern layer portion 1305 is in line with the channel 1306 of active device 1304. The simulations were conducted by modeling the active layer as silicon, the patterned layer as silicon dioxide, and various materials for the strain layer including strained silicon nitride. The handle substrate was on the order of 200 µm thick and 100 mm wide. The diffusion region of the active layer was 70 nm thick and as wide as the handle. The original buried insulator thickness was 100 nm. Various other simulations were conducted using similar materials with dimensions of the same orders of magnitude, and the same general relationships were observed. Both FIGS. 14 and 15 include three separate cross section strain diagrams and a set of x and y axes. The three separate cross section strain diagrams each illustrate points on the line charted in the respective axes.

FIG. 14 includes three cross sections to illustrate the effect of pattern height on the strain induced in channel 1306. Cross section 1400 illustrates a relatively thin pattern height with a thickness of 0.05 µm. Cross section 1401 illustrates a moderate pattern height of 0.2 um. Cross section 1401 illustrates a relatively large pattern height of 0.5 um. Chart 1403 has an x-axis 1404 that charts pattern height in units of microns, and a y-axis 1405 that charts uniaxial strain in the channel 1306 per 1 giga-pascal (GPa) of stress in the strain layer. Each cross section appears as a point on chart 1403. Notably, strain increases rapidly for an increase in pattern height till about 200 nm and then flattens out and even dips slightly as the height increases. This effect is caused by the geometry of the patterned layer and strain layer. If the pattern is not tall enough, there is not enough of a delta between the effect of the strain layer on the channel as compared to its effect on regions of the active layer that lie outside the channel. This is apparent from a comparison of the strain diagrams in cross sections 1400 and 1401 where the strain is notably higher in channel 1306 of cross section 1401. However, at a certain height, the ability of the patterned layer to fully shield the channel from the strain layer, and thereby maximize the delta between the channel and the surrounding region, is exhausted. This is apparent from a comparison of the strain diagrams in cross sections 1401 and 1402.

FIG. 15 includes three cross sections to illustrate the effect of strain layer thickness on the strain induced in channel 1306. In each cross section, the patterned layer height is set to 200 nm. Cross section 1500 illustrates strain in channel 1306 with a strain layer thickness of 20 nm. Cross section 1501 illustrates strain in channel 1306 with a strain layer thickness of 150 nm. Cross section 1502 illustrates strain in channel 1306 with a strain layer thickness of 300 nm. Chart 1503 has an x-axis 1504 that charts strain layer thickness in units of microns, and a y-axis 1505 that charts uniaxial strain in the channel 1306 per 1 GPa of stress in the strain layer. Notably, strain in the channel increases rapidly for increasing strain layer thickness until about 0.1 microns and then reaches a maximum somewhere in the range of 0.1 to 0.25 um. The reason the curve rises and then falls is because two countervailing factors are at play. The first factor is a material factor relating to the ability of the strain layer to exert force on the active layer. If the layer is too thin, it is compositionally unable to exert significant force on the active layer because the force the film is able to exert from its stress is directly proportional to its height. This effect is illustrated by a comparison of cross sections 1500 and 1501 where the channel is not strained in cross section 1500, but is strained significantly in cross section 1501. However, if the layer is too thick, a geometric effect acts to counteract the increased force of the strain layer as the strain layer itself absorbs the stress of the strain layer in an arch over the patterned layer instead of in the pattered layer itself.

The fact that the maxima in FIG. 15 occurs around 0.2 microns is not coincidental. As stated, the pattern layer height in these simulations is also 0.2 microns. Although a one-to-one ratio of pattern layer height to strain layer thickness did not provide the absolute maximum uniaxial strain per stress in every simulation, the one-to-one ratio was generally close enough to the maximum that it can be applied to achieve beneficial results with reasonable certainty. The ratio of the height of the pattern layer to the thickness of the strain layer seemed to produce beneficial results when in a range from 0.75 to 1.5. If all other considerations are equal, a ratio of one can be used to provide the largest guard band for targeting maximum uniaxial strain in the channel for stress in the strain layer.

Figure 16:
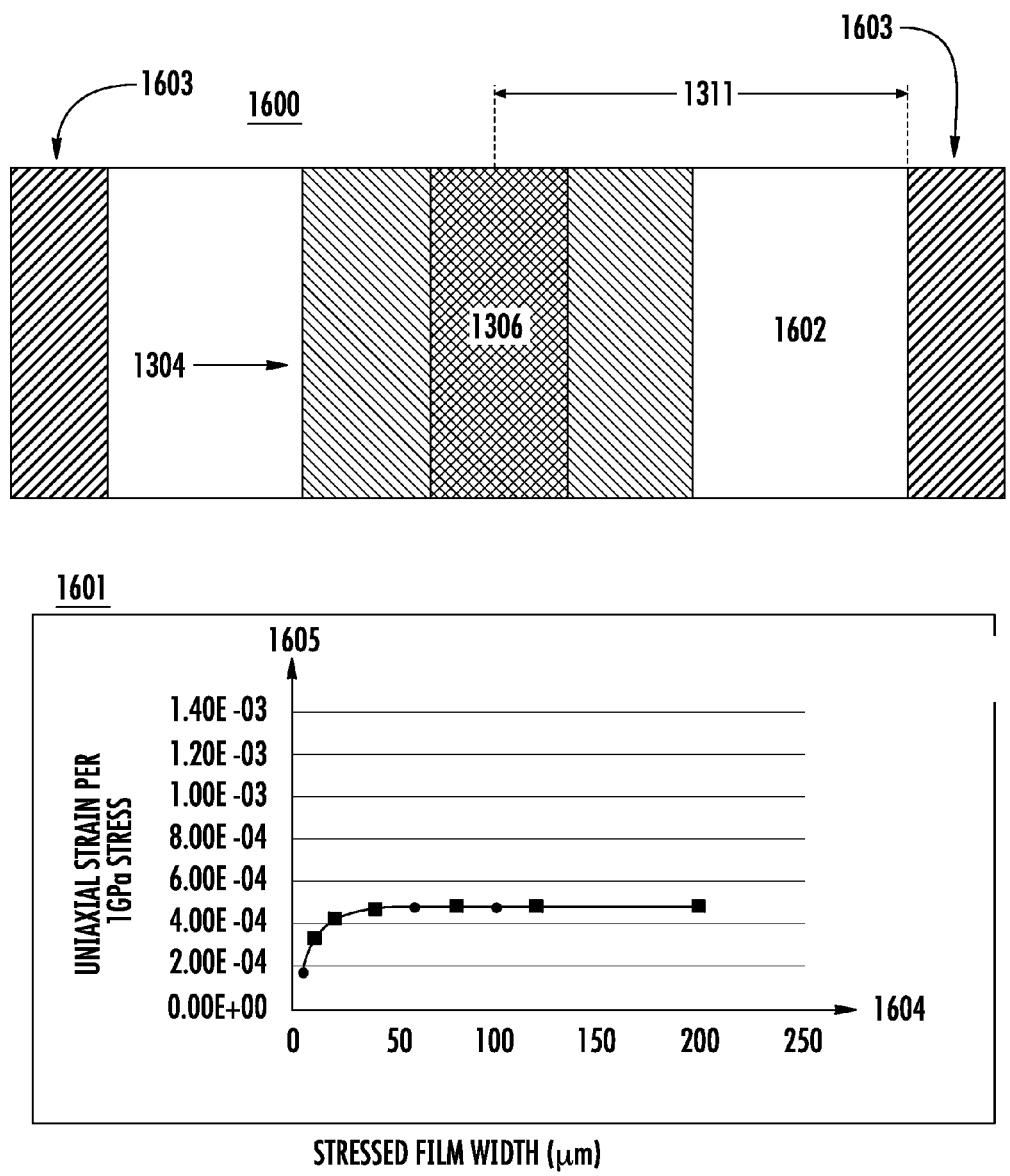
FIG. 16 illustrates a plan view of the semiconductor structure from FIG. 13 and a corresponding chart of stressed film width against uniaxial strain in the channel of the semiconductor structure from FIG. 13 that is in accordance with embodiments of the present invention.

FIG. 16 displays a plan view 1600 of the semiconductor structure that is shown in cross section 1300. FIG. 16 also includes chart 1601 with an x-axis 1604 that charts the spacing between boarder regions 1603 of the patterned layer in units of microns, and a y-axis 1605 that charts uniaxial strain in the channel 1306 per 1 GPa of stress in the strain layer. The plan view is from a bottom up perspective showing the back side of the structure. However, plan view 1600 does not show the strain layer or the pattern layer in between boarder regions 1603 such that channel region 1306 is visible along with the source and drain regions. The plan view also does not show the portion of patterned layer that would overly the channel but instead shows the boarders of patterned region 1603 that are set back from the area of channel region 1306. Dimension 1311 from cross section 1300 is shown to indicate the distance between pattern boarder regions 1603 and the center of channel 1306. The spacing between the patterned layer and the active device is shown by region 1602. X-axis 604 charts a dimension that is equal to twice the distance shown by dimension 1311 for devices in which the pattern layer opening is symmetrical about the channel.

As shown in chart 1601, increasing dimension 1311 provides a significant increase in the degree of strain delivered to channel 1306 of the active device 1304 up until roughly 25 µm on either side of the device. Notably, this effect is dependent upon the length of the channel, and the simulations used to generate chart 1601 assumed a device length of less than 1 µm. As dimension 1311 is increased, there is more area in which the strain layer can exert a differing force between the portions of active device 1304 that are covered by the patterned layer and those that are not. As a result, the strain in the active device increases. However, after a certain point, this effect exhausts itself as the increase in dimension 1311 has an effect that is too physically remote from channel 1306 to alter the strain therein. Also, dimension 1311 cannot be increased indefinitely without having a deleterious effect on the semiconductor structure as a whole. At a certain point, the effect of strain layer will being to have a wafer-wide effect and may start to cause bowing in the entire wafer which can lead to serious defects in the semiconductor device as a whole. In specific approaches, another strain layer can be added to the back side of the device to serve as a counter-strain layer. The counter-strain layer can exert an opposite strain force on the active layer as compared to the strain layer to cancel global wafer strain while maintaining the efficacy of the strain layer on a localized level. Regardless, it is beneficial to limit dimension 1311 to prevent globalized wafer strain from approaching problematic levels in the first place.

The simulations used to generate chart 1601 show a factor of 10 relationship between the length of channel 1306 and dimension 1311 as the point at which the advantage of increasing dimension 1311 significantly diminishes. Therefore, in some embodiments, for a channel length of less than 1 μm, dimension 1311 should be greater than 10 μm to adequately capture the benefits to the strain induced in the channel. However, dimension 1311 should be kept close to 10 μm so as to prevent wafer-wide warping.

Figure 17:
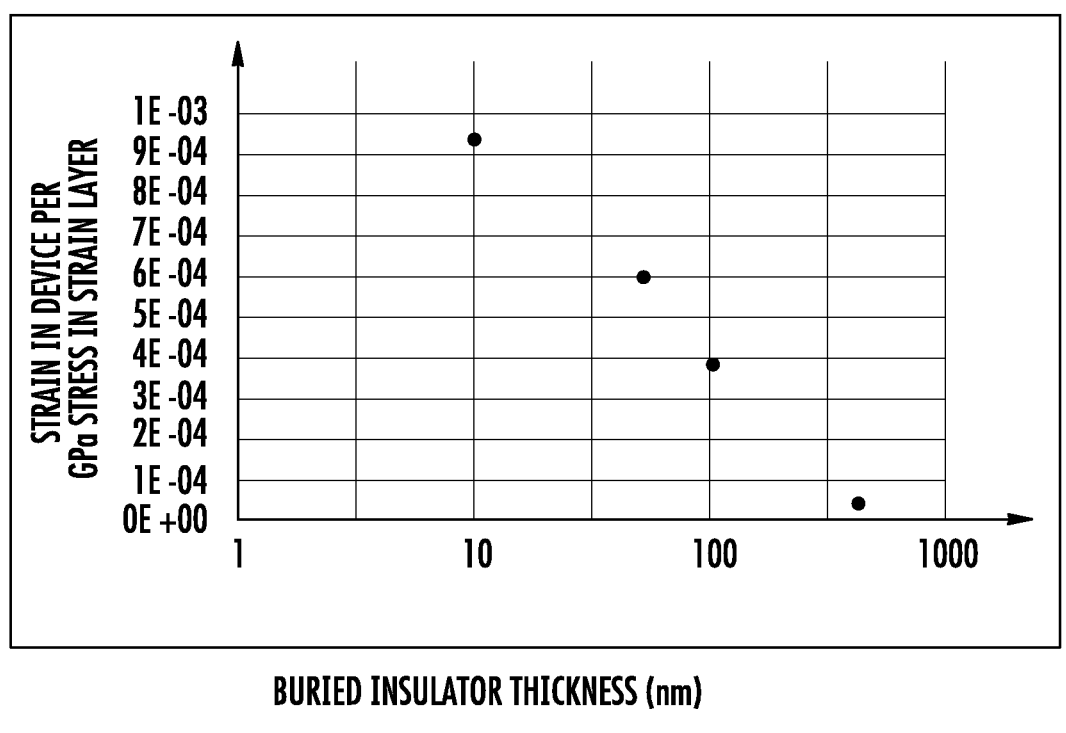
FIG. 17 illustrates a chart of buried oxide thickness against strain in the channel of a semiconductor structure discussed with reference to FIG. 13 that is in accordance with embodiments of the present invention.

FIG. 17 contains a chart 1700 of the results of a similar simulation as described above to illustrate the logarithmic decrease in induced strain owing to the thickness of the buried insulator layer. In chart 1700, the x-axis 1701 provides the thickness of the buried insulator layer in nanometers while the y-axis 1702 provides the uniaxial strain in the channel 1306 per 1 GPa of stress in the strain layer. The simulations were run with a patterned layer of aluminum and a strained layer of silicon nitride deposited on the back side of the buried insulator. However, as mentioned above, the buried insulator itself can serve as the patterned layer described with reference to FIGS. 13-16.

Although embodiments of the invention have been discussed primarily with respect to specific embodiments thereof, other variations are possible. Various configurations of the described system may be used in place of, or in addition to, the configurations presented herein. For example, although the devices were discussed often with reference to silicon substrates and oxide insulator layers the invention will function with any form of semiconductor-on-insulator wafers, structures, or devices. For example, the invention will function in combination with silicon-on-sapphire structures. In addition, the invention can function or operate upon circuitry using any form of technology such as CMOS, bipolar, BiCMOS, SiGe, Ga, As, InGaAs, GaN and any other form of semiconductor technology or compound semiconductor technology. As mentioned above, the insulator layer does not need to be fully removed. The insulator layer could be left intact and a thermal dissipation layer, strain layer, or patterned layer could then be disposed on the surface of the insulator layer. In addition, the entire insulator layer can be thinned instead of being fully removed, or an excavated insulator region can be formed which contains a residual thinned insulator layer. In addition, multiple strain layers and pattern layers can be placed on the back side of the device to create different strain patterns and/or to counteract the induced strain of lower layers to limit the effect of global strain. In addition, there may be additional layers of materials disposed between those layers mentioned herein. Semiconductor processing is a highly detailed field, and layers were only mentioned herein if they were absolutely necessary to describe the invention to avoid confusion. For example, there may be layers of passivation disposed on the active layer to prevent the circuitry from reacting with its environment. In addition, the use of the word "layer" such as when describing an active layer or an insulator layer does not preclude such layers being comprised of more than one material. For example, there may be layers of glass or some other insulator below metal lines in active circuitry in addition to a silicon-dioxide insulator beneath the entire active layer of an SOI structure. However, the term insulator layer can cover the entire structure of the glass and silicon-dioxide insulator.

Those skilled in the art will appreciate that the foregoing description is by way of example only, and is not intended to limit the invention. Nothing in the disclosure should indicate that the invention is limited to systems that require a particular form of semiconductor processing or to integrated circuits. Functions may be performed by hardware or software, as desired. In general, any diagrams presented are only intended to indicate one possible configuration, and many variations are possible. Those skilled in the art will also appreciate that methods and systems consistent with the present invention are suitable for use in a wide range of applications encompassing any related to the dissipation of heat from electronic or photonic devices.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A semiconductor-on-insulator (SOI) structure comprising:
   a patterned layer formed in an insulating material of the SOI structure, the patterned layer consisting of an excavated region and a pattern region;
   a strain layer located beneath the patterned layer and in the excavated region and on the pattern region;
   an active layer located above the strain layer and the patterned layer;
   a field effect transistor formed in the active layer, wherein the field effect transistor comprises a source, a drain, and a channel; and
   a handle layer located above the active layer;
   wherein the channel lies completely within a lateral extent of the pattern region;
   wherein the source and the drain each lie only partially within the lateral extent of the pattern region; and
   wherein the strain layer alters a carrier mobility of the channel.

2. The semiconductor-on-insulator structure of claim 1, wherein:
   the patterned layer has a height equal to a depth of the excavated region;
   the strain layer has a front surface in contact with the patterned layer and a back surface;
   the strain layer has a thickness equal to a distance between the back surface and the front surface; and
   a ratio of the height of the patterned layer to the thickness of the strain layer is within a range from 0.75 to 1.5.

3. The semiconductor-on-insulator structure of claim 2, further comprising:

a buried insulator of the semiconductor-on-insulator structure that is in contact with both the patterned layer and the active layer;

wherein the buried insulator is less than 1 micron thick; and wherein the patterned layer is formed on the buried insulator.

4. The semiconductor-on-insulator structure of claim 1, further comprising:

a portion of the excavated region that extends laterally from below the source to beyond a periphery of the field effect transistor;

wherein a lateral dimension of the portion of the excavated region in a direction away from the channel is larger than a length of the channel by a factor of 10.

5. The semiconductor-on-insulator structure of claim 4, wherein:

the channel of the field effect transistor is less than 1 micron long; and the lateral dimension of the portion of the excavated region is greater than 10 microns.

6. The semiconductor-on-insulator structure of claim 1, further comprising:

a buried insulator of the semiconductor-on-insulator structure;

wherein the buried insulator is the patterned layer.

7. The semiconductor-on-insulator structure of claim 6, further comprising:

a counter-strain layer formed on a back side of the strain layer;

wherein the counter-strain layer exerts an opposite strain force on the active layer as compared to the strain layer.

8. A semiconductor structure comprising:

an active layer bonded to a handle layer, wherein the handle layer is on a first side of the active layer;

a patterned layer of insulating material on a second side of the active layer, wherein the pattern layer consists of an excavated region and a pattern region; and a strain layer located on the pattern region and in the excavated region, wherein the strain layer exhibits a strain on a device in the active layer;

wherein the device is a field effect transistor having a source, a drain, and a channel, the channel being between the source and the drain; and wherein the pattern region laterally at least fully encompasses the channel.

9. The semiconductor structure of claim 8, wherein:

the patterned layer has a height equal to a depth of the excavated region;

the strain layer has a front surface in contact with the patterned layer and a back surface;

the strain layer has a thickness equal to a distance between the back surface and the front surface; and a ratio of the height of the patterned layer to the thickness of the strain layer is within a range from 0.75 to 1.5.

10. The semiconductor structure of claim 9, wherein:

the ratio is 1.

11. The semiconductor structure of claim 8, further comprising:

a portion of the excavated region that extends laterally from a portion of the pattern region that partially encompasses the source to beyond a periphery of the device;

wherein a lateral dimension of the portion of the excavated region in a direction normal to a width of the channel and away from the channel is larger than a length of the channel by a factor of 10.

12. The semiconductor structure of claim 11, wherein:

the channel of the device is less than 1 micron long; and the lateral dimension of the portion of the excavated region is greater than 10 microns.

13. The semiconductor structure of claim 8, further comprising:

a buried insulator on which the active layer is formed;

wherein the buried insulator is the patterned layer.

14. The semiconductor structure of claim 8, wherein:

a portion of the source that lies within a lateral extent of pattern region has a first lateral dimension in a direction away from the channel;

the first lateral dimension is larger than a length of the channel.

15. A semiconductor structure comprising:

an etched patterned layer formed in an insulating layer on a back side of semiconductor structure;

a strain layer formed on the etched patterned layer;

a handle layer bonded to a front side of the semiconductor structure;

an active layer located between the patterned layer and the handle layer; and a field effect transistor formed in the active layer, wherein the field effect transistor comprises an active area;

wherein the field effect transistor comprises a channel;

wherein a portion of the etched patterned layer has a lateral extent at least that of the channel;

wherein the field effect transistor has a lateral extent beyond the portion; and wherein the strain layer is in contact with the active area.

16. The semiconductor structure of claim 15, wherein:

the etched patterned layer has an etch depth;

the strain layer has a strain layer width; and a ratio of the etch depth to the strain layer width is within a range from 0.75 to 1.5.

17. The semiconductor structure of claim 15, further comprising:

a contiguous etched region of the etched pattern layer extends away from the portion to beyond a periphery of the field effect transistor;

wherein a dimension of the contiguous etched region measured along a direction parallel with the channel length is larger than the channel length by a factor of 10.

18. The semiconductor structure of claim 17, further comprising:

the channel length is less than 1 micron; and the dimension of the contiguous etched region is greater than 10 microns.

19. The semiconductor structure of claim 15, further comprising:

a part of the active area that is outside a lateral scope of the channel but within a lateral scope of the portion has a first lateral dimension in a direction away from the channel and perpendicular to the channel width; and the first lateral dimension is larger than the length of the channel.

20. The semiconductor structure of claim 15, further comprising:

a buried insulator layer in contact with the active layer and the strain layer;

wherein the buried insulator layer is the patterned layer;

wherein the buried insulator layer is silicon dioxide; and wherein the strain layer is silicon nitride.

* * * * *